US011862720B2

(12) United States Patent
Chen et al.

(10) Patent No.: US 11,862,720 B2
(45) Date of Patent: Jan. 2, 2024

(54) ROUGH BUFFER LAYER FOR GROUP III-V DEVICES ON SILICON

(71) Applicant: Taiwan Semiconductor Manufacturing Company, Ltd., Hsin-Chu (TW)

(72) Inventors: Kuei-Ming Chen, New Taipei (TW); Chi-Ming Chen, Zhubei (TW); Chung-Yi Yu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/867,877

(22) Filed: Jul. 19, 2022

(65) Prior Publication Data
US 2022/0367699 A1 Nov. 17, 2022

Related U.S. Application Data

(62) Division of application No. 16/806,108, filed on Mar. 2, 2020, now Pat. No. 11,515,408.

(51) Int. Cl.
*H01L 29/778* (2006.01)
*H01L 21/02* (2006.01)
*H01L 29/66* (2006.01)

(52) U.S. Cl.
CPC ...... *H01L 29/7786* (2013.01); *H01L 21/0262* (2013.01); *H01L 29/66462* (2013.01)

(58) Field of Classification Search
CPC ........... H01L 21/0262; H01L 29/66462; H01L 29/7786
See application file for complete search history.

(56) References Cited

U.S. PATENT DOCUMENTS 6,475,456 B2   11/2002   Nakano et al.
6,989,314 B2   1/2006   Rayssac et al.
(Continued)

FOREIGN PATENT DOCUMENTS

JP   2009096655 A   5/2009
JP   2015060883 A   3/2015
(Continued)

OTHER PUBLICATIONS

Chubarov et al., "Growth of aluminum nitride on flat and patterned Si (111) by high temperature halide CVD," Thin Solid Films 623 (2017) pp. 65-71.*

(Continued)

*Primary Examiner* — Jay C Kim
(74) *Attorney, Agent, or Firm* — Eschweiler & Potashnik, LLC

(57) ABSTRACT

Various embodiments of the present application are directed towards a group III-V device including a rough buffer layer. The rough buffer layer overlies a silicon substrate, a buffer structure overlies the rough buffer layer, and a heterojunction structure overlies the buffer structure. The buffer structure causes band bending and formation of a two-dimensional hole gas (2DHG) in the rough buffer layer. The rough buffer layer includes silicon or some other suitable semiconductor material and, in some embodiments, is doped. A top surface of the rough buffer layer and/or a bottom surface of the rough buffer layer is/are rough to promote carrier scattering along the top and bottom surfaces. The carrier scattering reduces carrier mobility and increases resistance at the 2DHG. The increased resistance increases an overall resistance of the silicon substrate, which reduces substrate loses and increases a power added efficiency (PAE).

20 Claims, 12 Drawing Sheets

(56) References Cited

U.S. PATENT DOCUMENTS

| | | | |
|---|---|---|---|
| 7,138,325 B2* | 11/2006 | Maleville | H01L 21/02008 |
| | | | 257/E21.119 |
| 7,327,036 B2* | 2/2008 | Borghs | H01L 21/0262 |
| | | | 438/933 |
| 7,368,763 B2 | 5/2008 | Miura et al. | |
| 7,915,626 B1* | 3/2011 | Allerman | H01L 21/0262 |
| | | | 257/95 |
| 8,013,320 B2 | 9/2011 | Matsuo et al. | |
| 8,482,103 B2 | 7/2013 | Liu et al. | |
| 8,487,316 B2 | 7/2013 | Cheng et al. | |
| 8,779,440 B2* | 7/2014 | Vielemeyer | H01L 21/0243 |
| | | | 257/78 |
| 8,835,988 B2 | 9/2014 | Marino et al. | |
| 8,896,022 B2* | 11/2014 | Imanishi | H01L 29/7786 |
| | | | 257/190 |
| 9,006,865 B2 | 4/2015 | Ikuta et al. | |
| 9,461,112 B1 | 10/2016 | Lee et al. | |
| 9,461,160 B2 | 10/2016 | Then et al. | |
| 9,558,943 B1 | 1/2017 | Pawlak | |
| 9,583,340 B2 | 2/2017 | Kim et al. | |
| 9,660,064 B2 | 5/2017 | Dasgupta et al. | |
| 9,978,589 B2 | 5/2018 | Han et al. | |
| 9,978,845 B2 | 5/2018 | Han et al. | |
| 10,027,086 B2 | 7/2018 | Bayram et al. | |
| 10,115,589 B2 | 10/2018 | Hagimoto et al. | |
| 10,164,082 B2 | 12/2018 | Brueck et al. | |
| 10,229,977 B2 | 3/2019 | Lu et al. | |
| 10,283,356 B2 | 5/2019 | Thapa et al. | |
| 10,435,812 B2 | 10/2019 | Han | |
| 10,453,996 B2 | 10/2019 | Brueck et al. | |
| 10,475,637 B2 | 11/2019 | Fan et al. | |
| 10,714,377 B2* | 7/2020 | Muri | H01L 22/26 |
| 10,896,818 B2 | 1/2021 | Han et al. | |
| 11,139,167 B2 | 10/2021 | El Khoury Maroun et al. | |
| 2002/0069816 A1 | 6/2002 | Gehrke et al. | |
| 2009/0001416 A1* | 1/2009 | Chua | H01L 21/0254 |
| | | | 257/190 |
| 2012/0003819 A1 | 1/2012 | Francis et al. | |
| 2013/0043489 A1 | 2/2013 | Kotani et al. | |
| 2014/0158976 A1 | 6/2014 | Dasgupta et al. | |
| 2016/0322225 A1 | 11/2016 | Chen et al. | |
| 2018/0286954 A1 | 10/2018 | Schultz et al. | |
| 2019/0228969 A1 | 7/2019 | Tan et al. | |
| 2020/0075314 A1 | 3/2020 | Chen et al. | |

FOREIGN PATENT DOCUMENTS

| | | |
|---|---|---|
| JP | 2016195241 A | 11/2016 |
| JP | 2017019710 A | 1/2017 |

OTHER PUBLICATIONS

Shen et al., "Pulsed laser deposition of hexagonal GaN-on-Si(100) template for MOCVD applications," Optics Xpress 21 (2013) 26468.

Cai et al., "Strain Analysis of GaN H EMTs on (111) Silicon with Two Transitional AlxGa 1-xN Layers," Materials 11 (2018) 1968.

Kim et al., "Characterization of GaN epitaxial layer grown on nano-patterned Si(111) substrate using Pt metal-mask," Journal of Microelectronics Packaging Society 21 (2014) pp. 67-71.

Lee et al., "Growth and Device Performance of AlGaN/GaN Heterostructure with AlSiC Precoverage on Silicon Substrate," Advances in Materials Science and Engineering vol. 2014, Article ID 290646 (2014).

Lin et al., "AlN thin films grown on epitaxial 3C—SiC (100) for piezoelectric resonant devices," Applied Physics Etters 97 (2010) 141907.

Avrutin et al., "Recent progress in nonpolar and semi-polar GaN light emitters on patterned Si substrates," Proceedings of SPIE 10532 (2018) 1053208.

Non-Final Office Action dated Oct. 13, 2021 for U.S. Appl. No. 16/806,108.

Final Office Action dated Jun. 17, 2022 for U.S. Appl. No. 16/806,108.

Notice of Allowance dated Jul. 29, 2022 for U.S. Appl. No. 16/806,108.

\* cited by examiner

ROUGH BUFFER LAYER FOR GROUP III-V DEVICES ON SILICON

REFERENCE TO RELATED APPLICATION

This application is a Divisional of U.S. application Ser. No. 16/806,108, filed on Mar. 2, 2020, the contents of which are hereby incorporated by reference in their entirety.

BACKGROUND

Semiconductor devices based on silicon have been the standard for the past few decades. However, semiconductor devices based on alternative materials are receiving increasing attention for advantages over silicon-based semiconductor devices. For example, semiconductor devices based on group III-V semiconductor materials have been receiving increased attention due to high electron mobility and wide band gaps compared to silicon-based semiconductor devices. Such high electron mobility and wide band gaps allow improved performance and high temperature applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6-16 illustrate a series of cross-sectional views of some embodiments of a method for forming a group III-V device comprising a rough buffer layer.

DETAILED DESCRIPTION

Figure 1:
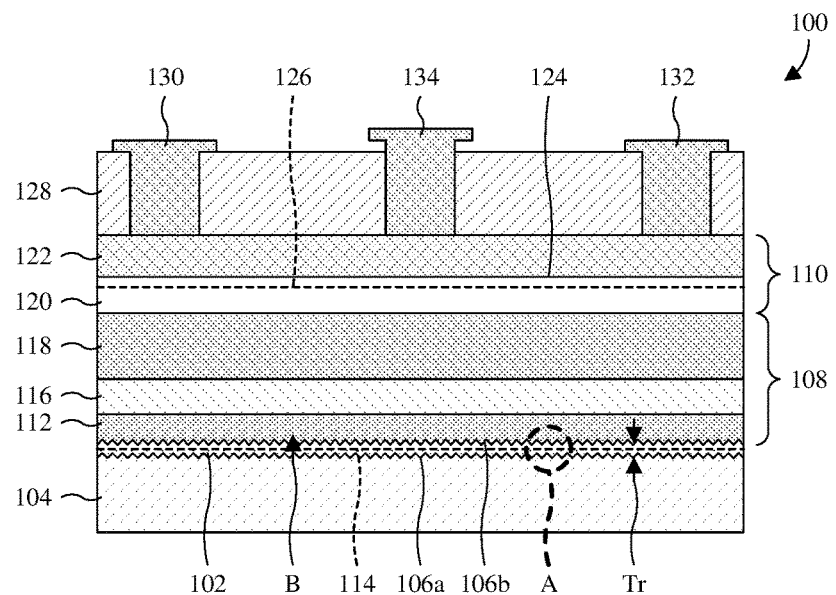
FIG. 1 illustrates a cross-sectional view of some embodiments of a group III-V device comprising a rough buffer layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a group III-V device is formed on a silicon substrate because silicon substrates are, among other things, cheap and readily available in a wide variety of sizes. Further, in some embodiments, the group III-V device comprises an aluminum nitride (e.g., AlN) buffer layer and a group III-V heterojunction structure overlying the aluminum nitride buffer layer. The aluminum nitride buffer layer directly contacts the silicon substrate at an interface and serves as a seed for epitaxially forming an overlying layer (e.g., another buffer layer).

A challenge with the group III-V device is that the aluminum nitride buffer layer induces band bending at the interface and the band banding results in the formation of a two-dimensional hole gas (2DHG) in the silicon substrate. The 2DHG extends along the interface and has a high concentration of mobile holes. Further, the interface is flat, such that carrier mobility is high at the interface. The 2DHG and the high carrier mobility lead to a low resistance at the interface, such that an average resistance of the silicon substrate is reduced. This leads to substrate losses that reduce the power added efficiency (PAE) of the group III-V device when used for radiofrequency (RF) applications.

Various embodiments of the present application are directed towards a group III-V device comprising a rough buffer layer. The rough buffer layer overlies a silicon substrate, a group III-V buffer structure overlies the rough buffer layer, and a group III-V heterojunction structure overlies the group III-V buffer structure. The group III-V buffer structure causes band bending between the silicon substrate and the group III-V buffer structure, and the band bending leads to formation of a 2DHG in the rough buffer layer. The rough buffer layer comprises silicon or some other suitable semiconductor material and, in some embodiments, is doped with carbon, magnesium, zinc, arsenic, phosphorous, some other suitable element(s), or any combination of the foregoing. A top surface of the rough buffer layer and/or a bottom surface of the rough buffer layer is/are rough to promote carrier scattering along the top and bottom surfaces. The carrier scattering reduces carrier mobility at the 2DHG, which increases resistance at the 2DHG. The increased resistance increases an overall resistance of the silicon substrate, which increases a PAE of the group III-V device when used for RF applications.

With reference to FIG. 1, a cross-sectional view 100 of some embodiments of a group III-V device comprising a rough buffer layer 102 is provided. The group III-V device is on a substrate 104 and may, for example, be a group III-nitride device and/or a depletion mode high electron mobility transistor (D-HEMT). Other device types are, however, amenable. The substrate 104 is or comprises silicon and, in at least some embodiments, is devoid of group III-V semiconductor materials. For example, the substrate 104 may be or comprise monocrystalline silicon or some other suitable silicon material.

In some embodiments, a top surface of the substrate 104 is the same or substantially the same as the (111) lattice plane of the substrate 104. Substantially the same may, for example, mean that the (111) lattice plane and the top surface of the substrate 104 intersect at an offset angle of 4 degrees or less in each of the X, Y, and Z dimensions. Other suitable offset angles are, however, amenable in the X, Y, and Z dimensions. In some embodiments, the substrate 104 is a bulk semiconductor substrate and/or is a semiconductor wafer.

The rough buffer layer 102 overlies and directly contacts the substrate 104 at a first buffer interface 106a. Further, a group III-V buffer structure 108 overlies and directly contacts the rough buffer layer 102 at a second buffer interface 106b, and a group III-V heterojunction structure 110 overlies the group III-V buffer structure 108. The group III-V buffer structure 108 and the rough buffer layer 102 may, for example, compensate for differences in lattice constants, crystalline structures, thermal expansion coefficients, or any combination of the foregoing between the substrate 104 and the group III-V heterojunction structure 110. The group III-V buffer structure 108 comprises, among other layers, a seed buffer layer 112.

The seed buffer layer 112 overlies and directly contacts the rough buffer layer 102 at the second buffer interface 106b. Further, the seed buffer layer 112 serves as a seed or nucleation layer for growing a group III-V semiconductor layer on the substrate 104. The seed buffer layer 112 may, for example, be or comprise aluminum nitride (e.g., AlN), some other suitable group suitable III nitride, or some other suitable group III-V material. In some embodiments, the seed buffer layer 112 is a binary group III-V semiconductor material. Further, the seed buffer layer 112 may, for example, have a thickness of about 100-350 angstroms or some other suitable value. The seed buffer layer 112 induces band bending in the rough buffer layer 102 and the substrate 104. In at least some embodiments, such as, for example, where the substrate 104 and the rough buffer layer 102 are or comprises monocrystalline silicon, the band bending induces formation of a 2DHG 114. The 2DHG 114 extends along the first buffer interface 106a and/or the second buffer interface 106b at the rough buffer layer 102. Further, the 2DHG 114 has a high concentration of mobile holes and hence has a low resistance. The low resistance of the 2DHG 114 decreases an overall resistance of the substrate 104, which increases substrates losses and decreases PAE when the group III-V device is used for RF applications.

The rough buffer layer 102 counteracts negative effects of the 2DHG 114. A top surface of the rough buffer layer 102 and a bottom surface of the rough buffer layer 102 are rough so the first and second buffer interfaces 106a, 106b are rough. The roughness increases carrier scattering at the first and second buffer interfaces 106a, 106b and hence reduces carrier mobility at the 2DHG 114. The reduced carrier mobility increases resistance at the 2DHG 114 and hence increases an overall resistance of the substrate 104. The increased overall resistance reduces substrate losses and increases PAE when the group III-V device is used for RF applications. For example, the PAE may be increased from about 54% to about 57% at a frequency of about 6 gigahertz (GHz). Further, the increased overall resistance enhances co-planar waveguide (CPW) performance when the group III-V device is used for RF applications. CPW is a short loop test to measure substrate losses by comparing power out to power in to see how much power loss occurs during signal transfer. CPW may, for example, be enhanced from about −0.51 decibels (dB) to about −0.45 dB at a frequency of about 6 GHz.

In some embodiments, the top and bottom surfaces of the rough buffer layer 102 are "rough" in that the top and bottom surfaces are uneven and have slopes that vary periodically or randomly across the top and bottom surfaces. In some embodiments, the top and bottom surfaces of the rough buffer layer 102 are "rough" in that the top and bottom surfaces have bumps, hillocks, protrusions, some other suitable features, or any combination of the foregoing arranged periodically or randomly across the top and bottom surfaces. For example, the top and bottom surfaces may have saw toothed profiles. As another example, the top and bottom surfaces may have wavy profiles. Other profiles are, however, amenable.

In some embodiments, a thickness Tr of the rough buffer layer 102 is about 20-200 angstroms, about 20-110 angstroms, about 110-200 angstroms, or some other suitable value. In some embodiments, a total thickness variation (TTV) of the rough buffer layer 102 is about 1.2-5.0:1, about 1.2-3.1:1, about 3.1-5.0:1, or some other suitable ratio. In some embodiments, TTV is a ratio of the largest thickness value of the rough buffer layer 102 to the smallest thickness value of the rough buffer layer 102. For example, supposing the rough buffer layer 102 has a maximum thickness value of 68 angstroms and a minimum thickness value of 32 angstroms, the TTV would be about 2.1. If the thickness Tr is too small (e.g., less than about 20 angstroms or some other suitable value) and/or the TTV is too small (e.g., less than about 1.2:1 or some other suitable ratio), the rough buffer layer 102 may not have sufficient roughness to counteract the negative effects of the 2DHG 114. If the thickness Tr is too large (e.g., greater than about 200 angstroms or some other suitable value) and/or the TTV is too large (e.g., greater than about 5.0:1 or some other suitable ratio), crystalline quality of the seed buffer layer 112 may be poor and may hence lead to leakage current and increased substrate losses.

The rough buffer layer 102 is or comprises a semiconductor material with a narrow band gap, such as, for, example, silicon, germanium, some other suitable semiconductor material(s), or any combination of the foregoing. A narrow band gap may, for example, be a band gap less than that of the seed buffer layer 112 and/or less than about 1.3 electron volts (eV), 1.0 eV, or some other suitable value. In some embodiments, the band gap of the rough buffer layer 102 is less than that of a smallest band gap in the group III-V buffer structure 108. In some embodiments, a band gap of the rough buffer layer 102 and a band gap of the substrate 104 are within about 0.1 eV, 0.5 eV, 0.7 eV, or some other suitable value of each other. In some embodiments, the rough buffer layer 102 is or comprises a same material as the substrate 104. For example, the rough buffer layer 102 and the substrate 104 may be or comprise monocrystalline silicon. In at least some embodiments, the rough buffer layer 102 is devoid of group III-V semiconductor materials. In some embodiments, the rough buffer layer 102 is a material that may serve as a seed for epitaxially growing the seed buffer layer 112.

In some embodiments, the rough buffer layer 102 is doped with a buffer element. As seen hereafter, the buffer element may, for example, aid in formation of the rough buffer layer 102, and/or cause the rough buffer layer 102 to form, with rough surfaces. The buffer element may, for example, be carbon (e.g., C), magnesium (e.g., Mg), zinc (e.g., Zn), arsenic (e.g., Ar), phosphorous (e.g., P), or some other suitable buffer element. In some embodiments, the buffer element is an n-type dopant. For example, where the rough buffer layer 102 is or comprises silicon, the buffer element may be arsenic, phosphorous, or some other suitable n-type dopant for silicon. The n-type dopant has excess electrons, which counter the mobile holes in the 2DHG 114. By countering the mobile holes, the n-type dopant increases a resistance of the 2DHG 114. This increased resistance, in turn, reduces substrate losses, increases PAE, and enhances CPW. In alternative embodiments, the buffer element is a p-type dopant. In some embodiments, the rough buffer layer 102 is doped with multiple buffer elements, each as described above.

Referring back to the group III-V buffer structure 108, the group III-V buffer structure 108 further comprises a graded buffer layer 116 and an isolation buffer layer 118 stacked upon each other. The graded buffer layer 116 overlies the seed buffer layer 112 and is or comprises a group III-V semiconductor material with a first element and a second element respectively having atomic percentages that are graded. For example, the first element may have an atomic percentage increasing from a bottom surface of the graded buffer layer 116 to a top surface of the graded buffer layer 116, whereas the second element may have an atomic percentage decreasing from the bottom surface to the top surface. The graded buffer layer 116 may, for example, be or comprise aluminum gallium nitride (e.g., AlGaN), some other suitable group III nitride, or some other suitable group III-V material.

In some embodiments, the graded buffer layer 116 is or comprises a ternary group III-V material and the first and second elements of the graded buffer layer 116 are group III elements. For example, the graded buffer layer 116 may be or comprise aluminum gallium nitride, the first element may be germanium (e.g., Ge), and the second element may be aluminum (e.g., Al). In some embodiments, the seed buffer layer 112 is or comprises a binary group III-V, the second element of the graded buffer layer 116 is the group III element of the seed buffer layer 112, and a group V element of the graded buffer layer 116 is the same as that of the seed buffer layer 112. For example, the graded buffer layer 116 may be or comprise aluminum gallium nitride, the seed buffer layer 112 may be or comprise aluminum nitride, and the second element may be aluminum. In some embodiments, the graded buffer layer 116 has a thickness of about 0.5-1.5 micrometers or some other suitable value.

The isolation buffer layer 118 overlies the graded buffer layer 116 and is or comprises a group III-V semiconductor material doped with a buffer element so as to have a high resistance. The high resistance may, for example, be a resistance higher than that of a channel layer 120 hereafter discussed. The high resistance allows the isolation buffer layer 118 to act as "back barrier" for the channel layer 120 to reduce substrate losses and to increase the soft breakdown voltage of the group III-V device. The buffer element may, for example, be carbon, iron (e.g., Fe), some other suitable buffer element(s), or any combination of the foregoing. The isolation buffer layer 118 may be or comprise, for example, gallium nitride (e.g., GaN), some other suitable group III nitride, or some other suitable group III-V material.

In some embodiments, the isolation buffer layer 118 is or comprises a binary group III-V material that comprises a group III element of the graded buffer layer 116 and that further comprises a group V element of the graded buffer layer 116. For example, the isolation buffer layer 118 may be or comprise gallium nitride and the graded buffer layer 116 may be or comprise aluminum gallium nitride. In some embodiments, a thickness of the isolation buffer layer 118 is about 0.5-2.5 micrometers or some other suitable value.

The group III-V heterojunction structure 110 overlies the group III-V buffer structure 108 and comprises the channel layer 120 and a barrier layer 122. The barrier layer 122 overlies the channel layer 120 and is or comprises a group III-V semiconductor material. Further, the barrier layer 122 is polarized so positive charge is shifted towards a bottom surface of the barrier layer 122 and negative charge is shifted towards a top surface of the barrier layer 122. The polarization may, for example, result from spontaneous polarization effects and/or piezoelectric polarization effects. The barrier layer 122 may be or comprise, for example, aluminum gallium nitride, some other suitable group III nitride, or some other suitable group III-V material.

In some embodiments, the barrier layer 122 is or comprises a ternary group III-V material and/or comprises the same elements as the graded buffer layer 116. For example, the barrier layer 122 and the graded buffer layer 116 may be or comprise aluminum gallium nitride. In some embodiments, the barrier layer 122 is or comprises $Al_yGa_{1-y}N$, where y is about 0.1-0.2. In some embodiments, the barrier layer 122 has a thickness of about 5-30 nanometers or some other suitable thickness value.

The channel layer 120 underlies and directly contacts the barrier layer 122. Further, the channel layer 120 is an undoped group III-V semiconductor material with a band gap unequal to that of the barrier layer 122. Because of the unequal band gaps, the channel layer 120 and the barrier layer 122 define a heterojunction at a heterojunction interface 124 at which the channel layer 120 and the barrier layer 122 directly contact. Further, because the barrier layer 122 is polarized, a two-dimensional electron gas (2DEG) 126 forms in the channel layer 120. The 2DEG 126 extends along the heterojunction interface 124 and has a high concentration of mobile electrons. Because of the high concentration of mobile electrodes, the 2DEG 126 is conductive. The channel layer 120 may, for example, be or comprise gallium nitride, some other suitable group III nitride, or some other suitable group III-V material.

In some embodiments, the channel layer 120 is or comprises a binary group III-V material and/or comprises the same elements as the isolation buffer layer 118 but without the doping. For example, the channel layer 120 and the isolation buffer layer 118 may be or comprise aluminum gallium nitride. In some embodiments, the channel layer 120 has a thickness of about 0.2-0.6 micrometers or some other suitable thickness value.

A first passivation layer 128 overlies the group III-V heterojunction structure 110. A first source/drain electrode 130 and a second source/drain electrode 132 are laterally spaced from each other and extend through the first passivation layer 128 to the group III-V heterojunction structure 110. In some embodiments, the first and second source/drain electrodes 130, 132 make ohmic contact with the group III-V heterojunction structure 110. Further, a gate electrode 134 is laterally between the first and second source/drain electrodes 130, 132 and extends through the first passivation layer 128 to the group III-V heterojunction structure 110. The first passivation layer 128 may be or comprise silicon oxide and/or some other suitable dielectric(s). The first and second source/drain electrodes 130, 132 and/or the gate electrode 134 may be or comprise metal and/or some other suitable conductive material(s).

During use of the group III-V device, the gate electrode 134 generates an electric field that manipulates the continuity of the 2DEG 126 from the first source/drain electrode 130 to the second source/drain electrode 132. For example, when the gate electrode 134 is biased with a voltage that is more than a threshold voltage, the gate electrode 134 may generate an electric field depleting an underlying portion of the 2DEG 126 of mobile electrons and breaking the continuity. As another example, when the gate electrode 134 is biased with a voltage that is less than the threshold voltage, the 2DEG 126 may be continuous from the first source/drain electrode 130 to the second source/drain electrode 132.

In some embodiments, the substrate 104 is or comprises monocrystalline silicon; the rough buffer layer 102 is or comprises monocrystalline silicon doped with carbon, magnesium, zinc, phosphorous, or arsenic; the seed buffer layer 112 is or comprises aluminum nitride; the graded buffer layer 116 is or comprises aluminum gallium nitride; isolation buffer layer 118 is or comprises gallium nitride doped with carbon or iron; the channel layer 120 is or comprises undoped gallium nitride; and the barrier layer 122 is or comprises aluminum gallium nitride. Other materials are, however, amenable for one or more of the aforementioned layers (e.g., the seed buffer layer 112 and/or the rough buffer layer 102).

Figures 2A, 2B:
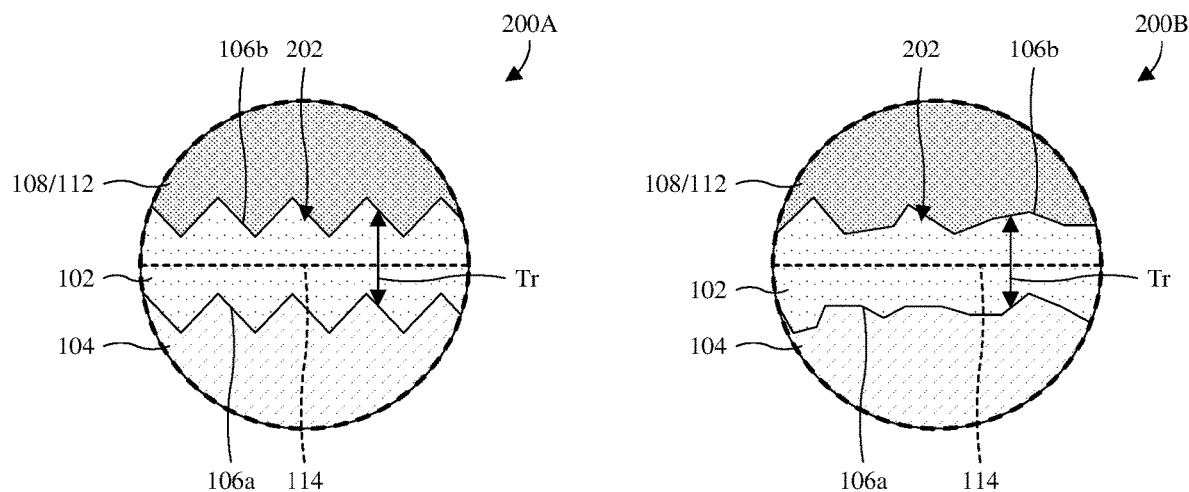
FIGS. 2A-2E illustrate enlarged cross-sectional views of various embodiments of the rough buffer layer of FIG. 1.

With reference to FIG. 2A, an enlarged cross-sectional view 200A of some embodiments of the rough buffer layer 102 of FIG. 1 is provided. The enlarged cross-sectional view 200A may, for example, be taken within the circle A in FIG. 1. The top and bottom surfaces of the rough buffer layer 102 have a plurality of features 202 arranged in periodic patterns across the top and bottom surfaces. Further, the features 202 are uniform or substantially uniform in shape and size and have a tooth-shaped profile, such that the top and bottom surfaces have saw-toothed profiles. Other shapes, sizes, profiles, or any combination of the foregoing are, however, amenable for the features 202. The features 202 may, for example, be bumps, hillocks, protrusions, some other suitable feature types, or any combination of the foregoing.

With reference to FIG. 2B, an enlarged cross-sectional view 200B of some alternative embodiments of the rough buffer layer 102 of FIG. 2A is provided in which the features 202 are randomly distributed across the top and bottom surfaces of the rough buffer layer 102 and have random variation in shape and size.

Figure 2C:
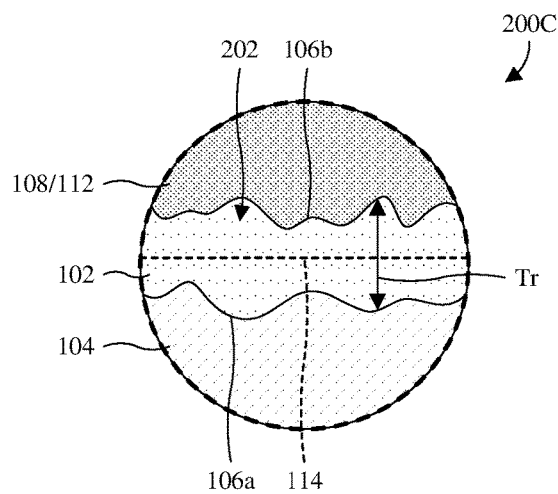

With reference to FIG. 2C, an enlarged cross-sectional view 200C of some alternative embodiments of the rough buffer layer 102 of FIG. 2B is provided in which the top and bottom surfaces of the rough buffer layer 102 are smoother. As such, the top and bottom surfaces of the rough buffer layer 102 have wavy profiles.

Figure 2D:
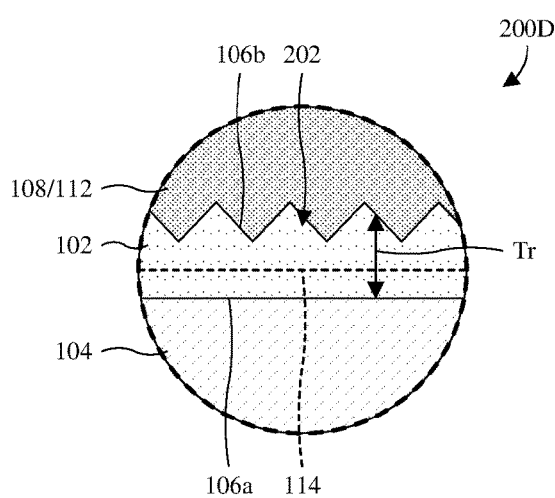
Figure 2E:
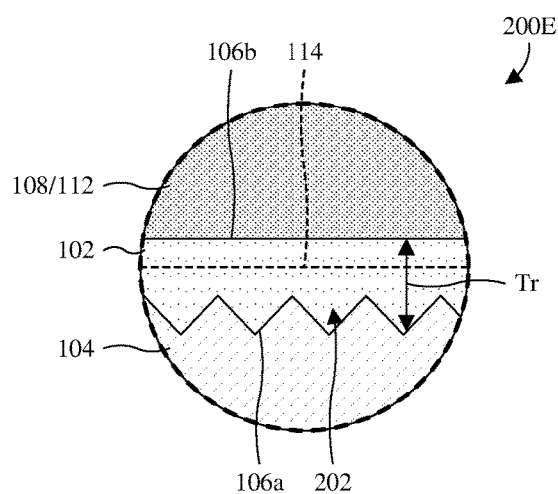

With reference to FIGS. 2D and 2E, enlarged cross-sectional views 200D, 200E of some alternative embodiments of the rough buffer layer 102 of FIG. 2A are provided in which the bottom or top surface of the rough buffer layer 102 is flat or substantially flat. In FIG. 2D, the bottom surface of the rough buffer layer 102 is flat or substantially flat. In FIG. 2E, the top surface of the rough buffer layer 102 is flat or substantially flat.

While FIGS. 2D and 2E illustrate alternative embodiments of the rough buffer layer 102 of FIG. 2A in which the bottom or top surface of the rough buffer layer 102 is flat or substantially flat, alternative embodiments of the rough buffer layer 102 of FIG. 2B may also have a bottom or top surface that is flat or substantially flat as in FIGS. 2D and 2E. Similarly, alternative embodiments of the rough buffer layer 102 of FIG. 2C may also have a bottom or top surface that is flat or substantially flat as in FIGS. 2D and 2E.

Figure 3A:
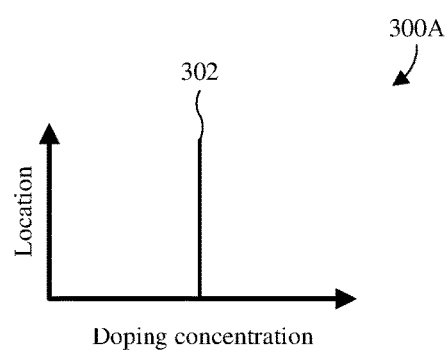
FIGS. 3A-3C illustrate graphs of various embodiments of a curve describing doping concentration of a buffer element along a thickness of the rough buffer layer of FIG. 1.
Figure 3B:
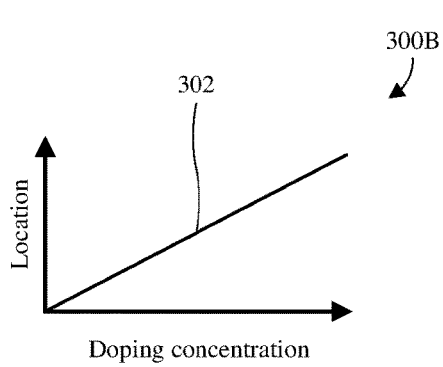
Figure 3C:
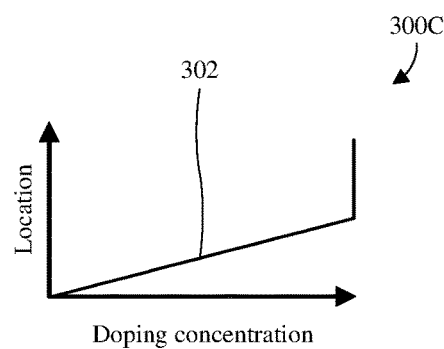

With reference to FIGS. 3A-3C, graphs 300A-300C of various embodiments of a curve 302 describing doping concentration of the buffer element along a thickness Tr of the rough buffer layer 102 of FIG. 1 is provided. As noted above, the buffer element may, for example, be carbon, magnesium, zinc, arsenic, phosphorous, or some other suitable buffer element. The horizontal axis corresponds to doping concentration, and the vertical axis corresponds to location in the rough buffer layer 102. The vertical axis may, for example, correspond to line B in FIG. 1.

In the graph 300A of FIG. 3A, the doping concentration of the buffer element is constant or substantially constant from the bottom surface of the rough buffer layer 102 to the top surface of the rough buffer layer.

In the graph 300B of FIG. 3B, the doping concentration of the buffer element increases continuously and linearly from the bottom surface of the rough buffer layer 102 to the top surface of the rough buffer layer 102. Gradually varying the doping concentration of the buffer element may help minimize stress and/or lattice mismatch from different crystalline structures of the substrate 104 and the seed buffer layer 112.

In the graph 300C of FIG. 3C, the doping concentration of the buffer element increases continuously and linearly from the bottom surface of the rough buffer layer 102 to a midpoint between the top surface of the rough buffer layer 102 and the bottom surface. Further, the doping concentration of the buffer element is constant or substantially constant from the midpoint to the top surface of the rough buffer layer 102.

While FIGS. 3A-3C illustrate some embodiments of the curve 302, other embodiments are amenable. For example, the curve 302 in any one of FIGS. 3B and 3C may be inverted. As another example, the curve 302 of FIG. 3B may discretely increase and/or may have a stepped profile from the bottom surface of the rough buffer layer 102 to top surface of the rough buffer layer 102. As yet another example, the curve 302 of FIG. 3C may discretely increase and/or may have a stepped profile from the bottom surface of the rough buffer layer 102 to the midpoint between the top and bottom surfaces of the rough buffer layer 102.

Figure 4A:
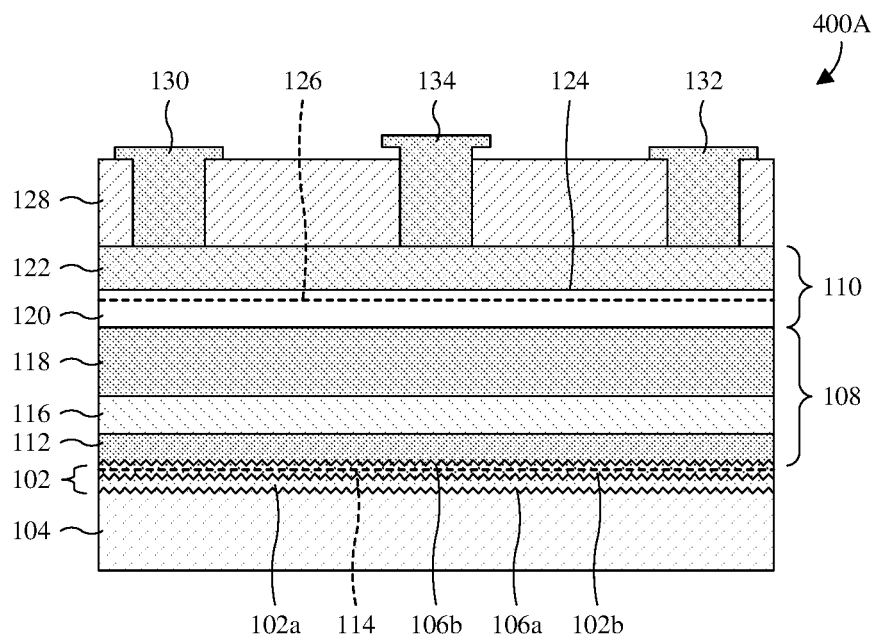
FIGS. 4A and 4B illustrate cross-sectional views of some alternative embodiments of the group III-V device of FIG. 1 in which the rough buffer layer comprises multiple sublayers.

With reference to FIG. 4A, a cross-sectional view 400A of some alternative embodiments of the group III-V device of FIG. 1 is provided in which the rough buffer layer 102 comprises a first rough buffer sublayer 102a and a second rough buffer sublayer 102b overlying the first rough buffer sublayer 102a. The first and second rough buffer sublayers 102a, 102b are each individually as the rough buffer layer 102 in FIG. 1 is illustrated and described. However, the first and second rough buffer sublayers 102a, 102b have different buffer elements and/or different doping concentrations for corresponding buffer elements. For example, the first rough buffer sublayer 102a may be doped with carbon and the second rough buffer sublayer 102b may be doped with magnesium. As another example, the first and second rough buffer sublayers 102a, 102b may be doped with carbon and respectively have different doping concentrations.

Figure 4B:
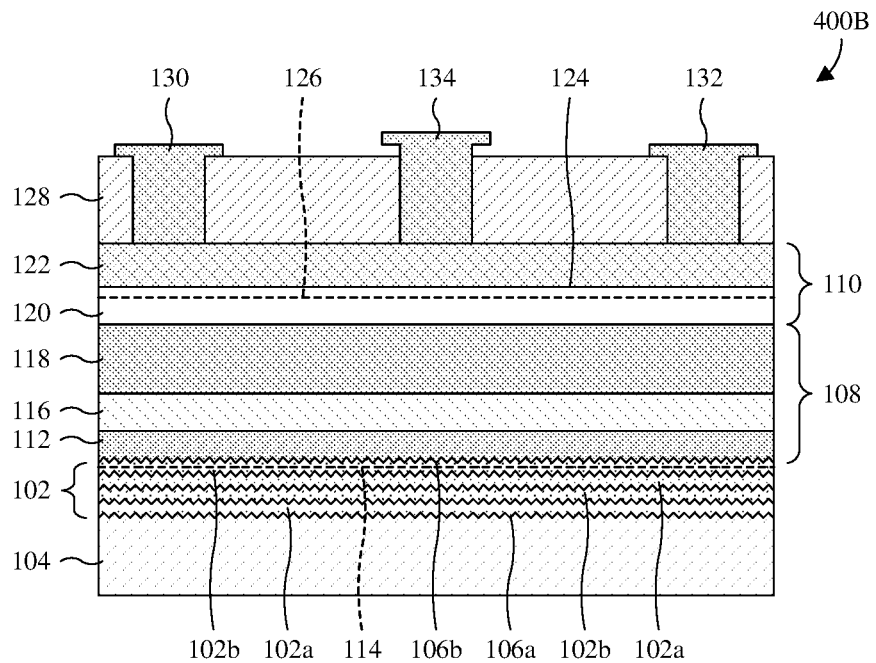

With reference to FIG. 4B, a cross-sectional view 400B of some alternative embodiments of the group III-V device of FIG. 4A is provided in which the first and second rough buffer sublayers 102a, 102b repeat multiple times to define a periodic pattern.

While the first rough buffer sublayer 102a of FIGS. 4A and 4B is as the rough buffer layer 102 in FIG. 1 is illustrated and described, the first rough buffer sublayer 102a may alternatively be as the rough buffer layer 102 in any of FIGS. 2A-2E is illustrated and described. Similarly, while the second rough buffer sublayer 102b of FIGS. 4A and 4B is as the rough buffer layer 102 in FIG. 1 is illustrated and described, the second rough buffer sublayer 102b may alternatively be as the rough buffer layer 102 in any of FIGS. 2A-2E is illustrated and described. In some embodiments, the first and second rough buffer sublayers 102a, 102b correspond to the same embodiments of the rough buffer layer 102 in FIGS. 1 and 2A-2E. In other embodiments, the first and second rough buffer sublayers 102a, 102b correspond to different embodiments of the rough buffer layer 102 in FIGS. 1 and 2A-2E.

Figure 5A:
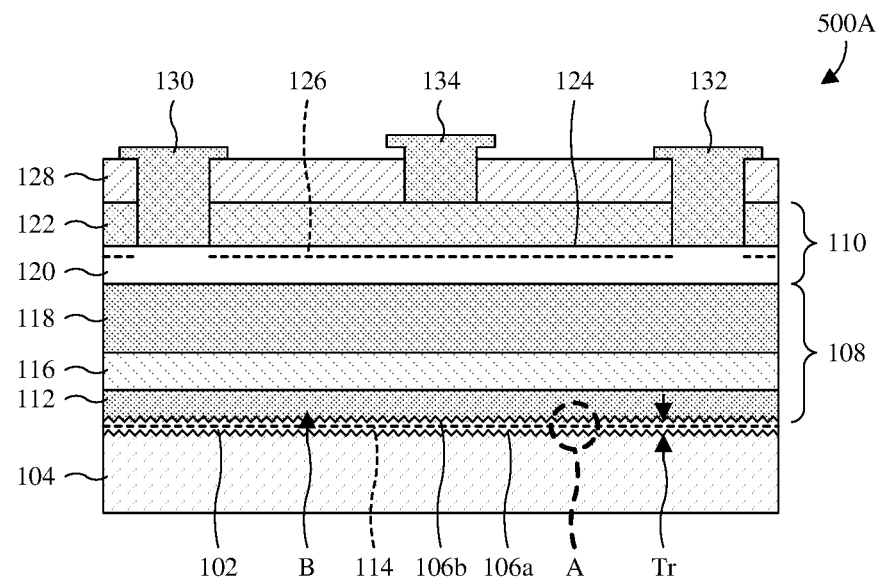
FIGS. 5A-5E illustrate cross-sectional views of various alternative embodiments of the group III-V device of FIG. 1 in which source/drain electrodes and gate electrodes are varied.

With reference to FIG. 5A, a cross-sectional view 500A of some alternative embodiments of the group III-V device of FIG. 1 is provided in which the first and second source/drain electrodes 130, 132 extend through the barrier layer 122 to the channel layer 120. As a result, the barrier layer 122 is cleared directly under the first and second source/drain electrodes 130, 132 and the 2DEG 126 has a break directly under the first and second source/drain electrodes 130, 132.

Figure 5B:
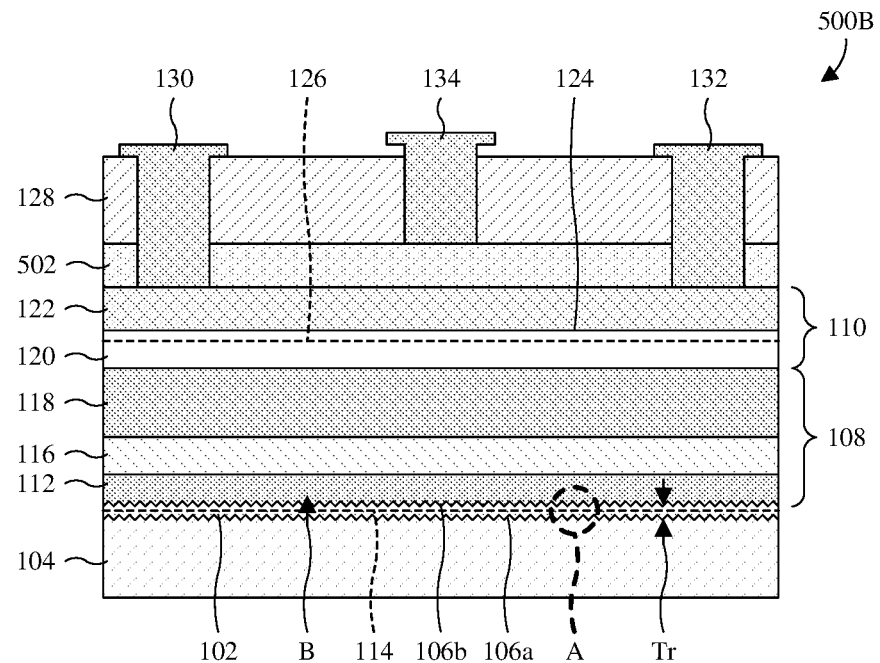

With reference to FIG. 5B, a cross-sectional view 500B of some alternative embodiments of the group III-V device of FIG. 1 is provided in which a cap layer 502 is between the group III-V heterojunction structure 110 and the first passivation layer 128. The cap layer 502 is or comprises an undoped group III-V semiconductor material with a band gap unequal to that of the barrier layer 122. The cap layer 502 may, for example, be or comprise gallium nitride, some other suitable group III nitride, or some other suitable group III-V material. In some embodiments, the cap layer 502 is or comprises a binary group III-V material and/or comprises the same elements as the channel layer 120.

In some embodiments, the cap layer 502 is or comprises gallium nitride, the barrier layer 122 is or comprises aluminum gallium nitride, and the cap layer 502 and the barrier layer 122 are formed in situ within a common process chamber and/or a common multi-chamber process tool. The cap layer 502 protects the barrier layer 122 during formation of the group III-V device so native oxide does not form from the barrier layer 122. Instead, native oxide may form from the cap layer 502. Native oxide from gallium nitride is more stable and more readily cleaned than native oxide from aluminum gallium nitride. Further, cleaning native oxide from the cap layer 502 does not risk damaging the barrier layer 122.

Figure 5C:
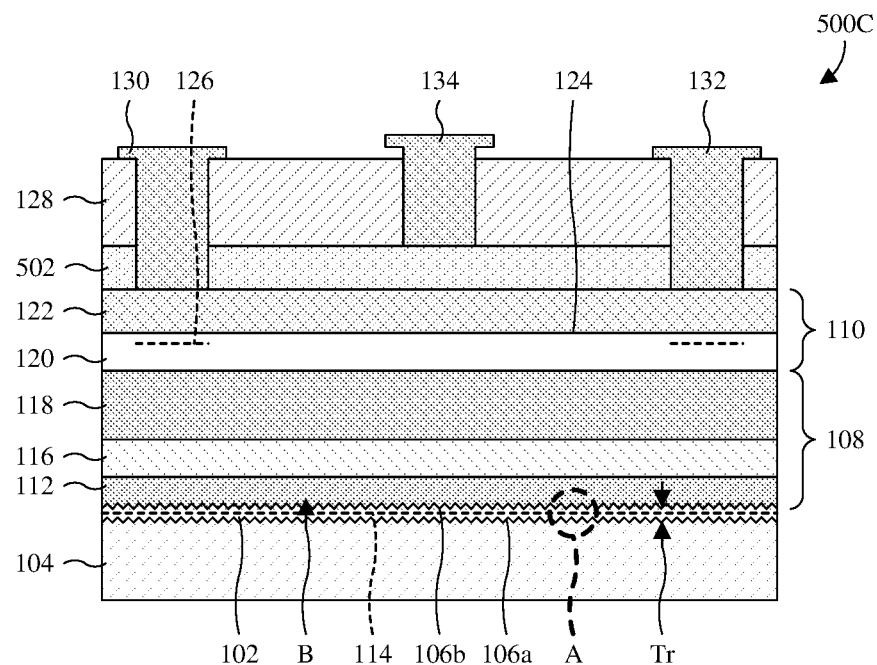

With reference to FIG. 5C, a cross-sectional view 500C of some alternative embodiments of the group III-V device of FIG. 5B is provided in which the cap layer 502 is doped p-type dopants. In alternative embodiments, the cap layer 502 may be doped with n-type. As a result of the p-type doping of the cap layer 502, the mobile electrons at the 2DEG 126 are dispersed, and the 2DEG 126 is dissolved, to sides of the first and second source/drain electrodes 130, 132. Hence, the group III-V device is an enhancement mode high electron mobility transistor (E-HEMT) or some other suitable device type.

Figure 5D:
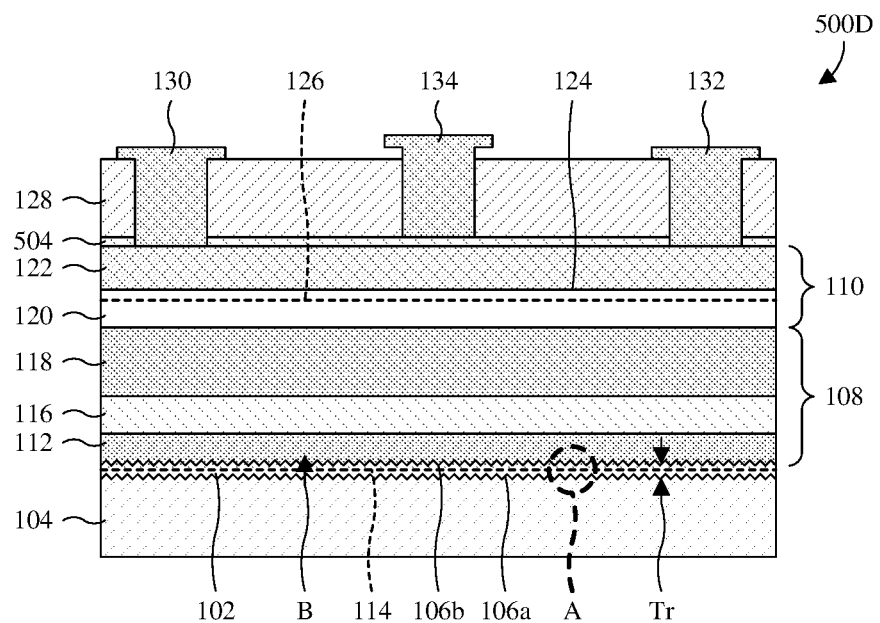

With reference to FIG. 5D, a cross-sectional view 500D of some alternative embodiments of the group III-V device of FIG. 5A is provided in which a gate dielectric layer 504 separates the gate electrode 134 from the group III-V heterojunction structure 110. As such, the group III-V device is a depletion mode metal-insulator-semiconductor HEMT (MIS-HEMT) or some other suitable device type. The gate dielectric layer 504 may, for example, be aluminum oxide, silicon oxide, some other suitable dielectric(s), or any combination of the foregoing.

Figure 5E:
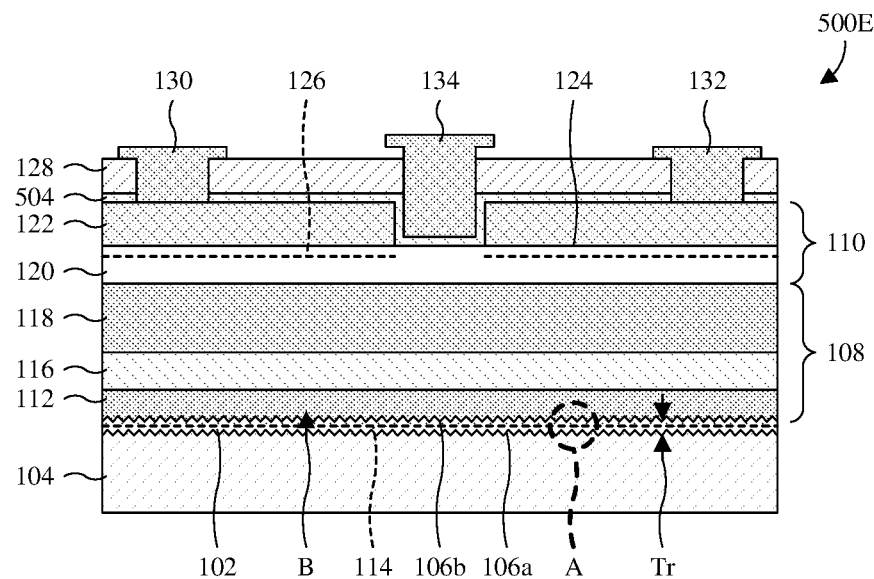

With reference to FIG. 5E, a cross-sectional view 500E of some alternative embodiments of the group III-V device of FIG. 5D is provided in which the gate electrode 134 and the gate dielectric layer 504 further extend through the barrier layer 122. As a result, the 2DEG 126 has a break at the gate electrode 134. Further, the group III-V device is an enhancement mode MIS-HEMT or some other suitable device type.

While the first and second source/drain electrodes 130, 132 extend to and terminate at a top surface of the barrier layer 122 in FIGS. 5B-5E, the first and second source/drain electrodes 130, 132 may alternatively extend through the barrier layer 122 to the channel layer 120. While the gate electrode 134 directly contacts combinations of the channel layer 120, the barrier layer 122, and the cap layer 502 in FIGS. 5A-5C, the gate electrode 134 may alternatively be separated from the channel layer 120, the barrier layer 122, and the cap layer 502 by the gate dielectric layer 504 of FIGS. 5D and 5E. While FIGS. 5A-5E illustrate the rough buffer layer 102 as having a single layer, the rough buffer layer 102 may alternatively have multiple layers as in FIGS. 4A and 4B. While FIGS. 5A-5E illustrate the rough buffer layer 102 as having a top surface and a bottom surface as in FIG. 1, the rough buffer layer 102 may alternatively have a top surface and/or a bottom surface as in any one of FIGS. 2A-2E.

Figure 6:
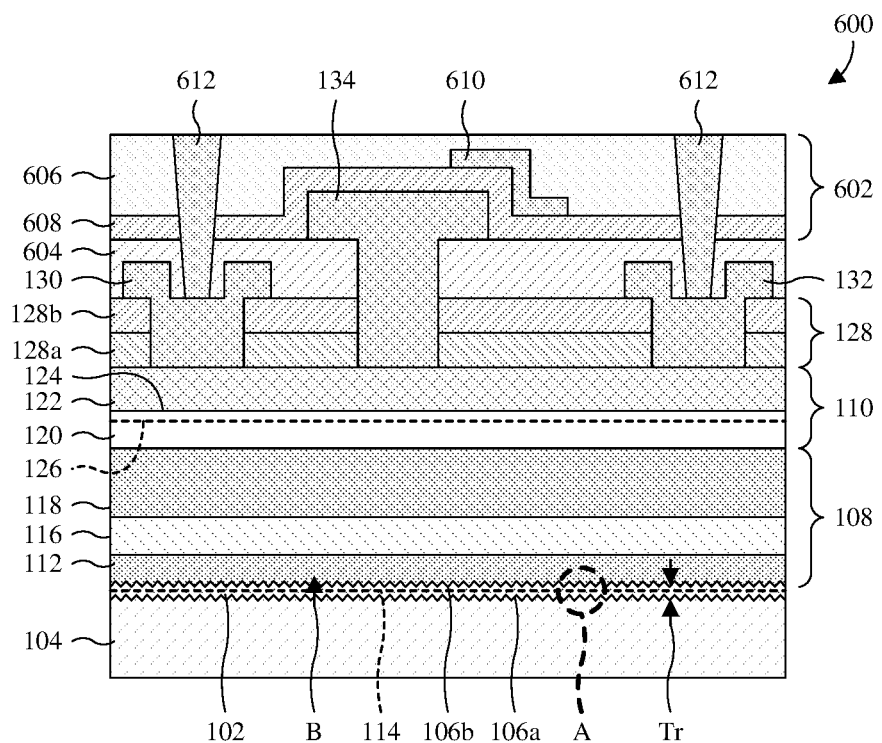

With reference to FIG. 6, a cross-sectional view 600 of some embodiments of the group III-V device of FIG. 1 is provided in which an interconnect structure 602 covers the gate electrode 134 and the first and second source/drain electrodes 130, 132. Further, a second passivation layer 604 is between the first passivation layer 128 and the interconnect structure 602, and the first passivation layer 128 comprises a lower dielectric layer 128a and an upper dielectric layer 128b overlying the lower dielectric layer 128a.

In some embodiments, the lower dielectric layer 128a is or comprises silicon oxide, silicon nitride, some other suitable dielectric(s), or any combination of the foregoing. In some embodiments, the upper dielectric layer 128b is or comprises plasma-enhanced silicon oxide and/or some other suitable dielectric(s). In some embodiments, the second passivation layer 604 is or comprises plasma-enhanced silicon nitride and/or some other suitable dielectric(s).

The interconnect structure 602 comprises an interlayer dielectric (ILD) layer 606 and an ILD liner 608 stacked over the gate electrode 134. The ILD liner 608 underlies the ILD layer 606 and separates the ILD layer 606 from the gate electrode 134 and the second passivation layer 604. The ILD liner 608 may be or comprise, for example, plasma-enhanced silicon oxide and/or some other suitable dielectric(s), whereas the ILD layer 606 may, for example, be or comprise non-plasma-enhanced silicon oxide and/or some other suitable dielectric(s). The interconnect structure 602 further comprises a field plate 610 and a plurality of contact vias 612.

The field plate 610 wraps around a top corner of the gate electrode 134 while remaining separated from the gate electrode 134 by the ILD liner 608. The contact vias 612 extend through the ILD layer 606 and the ILD liner 608 respectively to the first and second source/drain electrodes 130, 132. While not shown, one or more other contact vias extend through the ILD layer 606 to the gate electrode 134 and/or the field plate 610. Further, while not shown, wires and additional vias are alternatively stacked over and electrically coupled to the contact vias. The field plate 610 and the contact vias 612 may, for example, be or comprise metal and/or some other suitable conductive material(s).

While FIG. 6 describes alterations to the group III-V device of FIG. 1, the alterations at FIG. 6 are applicable to the group III-V device in any one of FIGS. 4A, 4B, and 5A-5E. For example, FIG. 5A may comprise the interconnect structure 602 of FIG. 6.

With reference to FIGS. 7-16, a series of cross-sectional views 700-1600 of some embodiments of a method for forming a group III-V device comprising a rough buffer layer is provided. The method is illustrated using embodiments of the group III-V device in FIG. 6 but may also form embodiments in any one of FIGS. 1, 4A, 4B, and 5A-5E.

Figure 7:
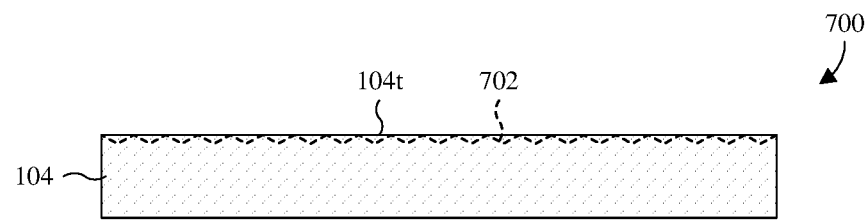
FIG. 7 illustrates a cross-sectional view of some embodiments of the group III-V device of FIG. 1 in which an interconnect structure covers a gate electrode and a pair of source/drain electrodes.

As illustrated by the cross-sectional view 700 of FIG. 7, a substrate 104 is provided. The substrate 104 is or comprises silicon and, in at least some embodiments, is devoid of group III-V semiconductor materials. For example, the substrate 104 may be or comprise monocrystalline silicon or some other suitable silicon material. In some embodiments, the substrate 104 is a bulk semiconductor substrate and/or a semiconductor wafer. In some embodiments, a top surface 104t of the substrate 104 is flat or substantially flat. Further, in some embodiments, the top surface 104t of the substrate 104 is the same or substantially the same as the (111) lattice plane of the substrate 104. Substantially the same may, for example, mean that the (111) lattice plane and the top surface 104t of the substrate 104 intersect at an offset angle of 4 degrees or less in each of the X, Y, and Z dimensions. Other suitable offset angles are, however, amenable in the X, Y, and Z dimensions.

Figure 8:
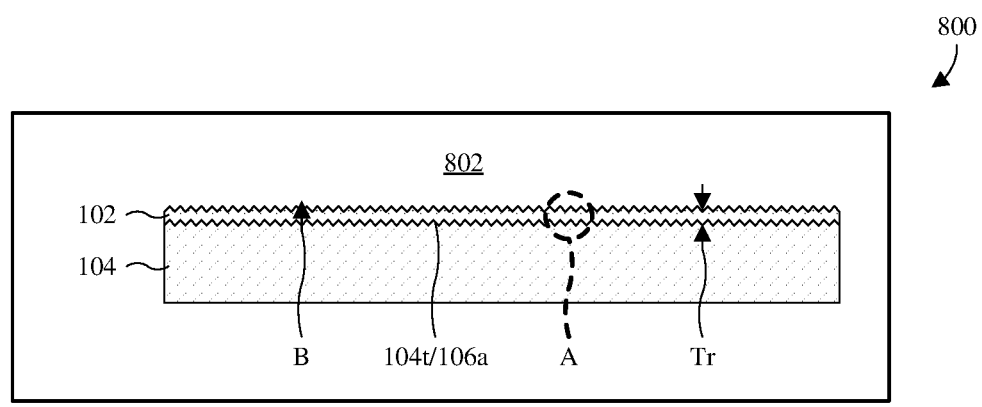

In some embodiments, before proceeding to the acts hereafter described with regard to FIG. 8, the top surface 104t of the substrate 104 is pre-roughened. Such pre-roughening may, for example, improve the roughness of a rough buffer layer hereafter formed (see, e.g., FIG. 8). The pre-roughening may, for example, be performed by a blanket wet or dry etch into the top surface 104t of the substrate 104, by a selective etch into the top surface 104t, or by some other suitable pre-roughening process. The selective etch may, for example, use photolithography to transfer a rough pattern to the top surface 104t of the substrate 104. In some embodiments in which the top surface 104t of the substrate 104 is pre-roughened, the top surface 104t has the profile illustrated by a dashed line 702. Other profiles are, however, amenable.

As illustrated by the cross-sectional view 800 of FIG. 8, a rough buffer layer 102 is formed overlying and directly contacting the top surface 104t of the substrate 104 at a first buffer interface 106a. Further, the rough buffer layer 102 is formed within a first process chamber 802. A bottom surface of the rough buffer layer 102 is rough so the top surface 104t of the substrate 104 and the first buffer interface 106a are rough. Further, a top surface of the rough buffer layer 102 is rough. FIG. 2A illustrates an enlarged cross-sectional view 200A of some embodiments of the rough buffer layer 102 within circle A, and FIGS. 2B-2D illustrate enlarged cross-sectional views 200B-200D of some alternative embodiments of the rough buffer layer 102 within circle A. As seen hereafter, the roughness increases a resistance at the first buffer interface 106a to increase PAE when the group III-V device is used for RF applications.

In some embodiments, the top and bottom surfaces of the rough buffer layer 102 are "rough" in that the top and bottom surfaces are uneven and have slopes that vary periodically or randomly across the top and bottom surfaces. In some embodiments, the top and bottom surfaces of the rough buffer layer 102 are "rough" in that the top and bottom surfaces have bumps, hillocks, protrusions, some other suitable features, or any combination of the foregoing arranged periodically or randomly across the top and bottom surfaces. In some embodiments, the top and bottom surfaces have saw-toothed profiles, wavy profiles, serpentine profiles, or some other suitable profiles. In some embodiments, a thickness Tr of the rough buffer layer 102 is about 20-200 angstroms, about 20-110 angstroms, about 110-200 angstroms, or some other suitable value. In some embodiments, a TTV of the rough buffer layer 102 is about 1.2-5.0, about 1.2-3.1, about 3.1-5.0, or some other suitable value.

The rough buffer layer 102 is or comprises a semiconductor material with a narrow band gap, such as, for, example, silicon, germanium, some other suitable semiconductor material(s), or any combination of the foregoing. A narrow band gap may, for example, be a band gap less than that of the seed buffer layer 112 and/or less than about 1.3, 1.0, or some other suitable value. In some embodiments, a band gap of the rough buffer layer 102 and a band gap of the substrate 104 are within about 0.1 eV, 0.5 eV, 0.7 eV, or some other suitable value of each other. In some embodiments, the rough buffer layer 102 is or comprises a same material as the substrate 104. In at least some embodiments, the rough buffer layer 102 is devoid of group III-V semiconductor materials. In some embodiments, the rough buffer layer 102 is a material that may serve as a seed for epitaxially growing a seed buffer layer hereafter discussed.

In some embodiments, the rough buffer layer 102 is doped with a buffer element. The buffer element may, for example, aid in or otherwise cause formation of the rough buffer layer 102 with top and bottom surfaces that are rough. For example, the buffer element may replace a semiconductor element in the crystalline lattice of the rough buffer layer 102 to cause the roughness at the top and bottom surfaces of the rough buffer layer 102. FIGS. 3A-3C illustrate various embodiments of a curve 302 describing doping concentration of the buffer element along the thickness Tr of the rough buffer layer 102 and/or along line B. The buffer element may, for example, be or comprise carbon, magnesium, zinc, arsenic, phosphorous, or some other suitable buffer element. In some embodiments, the buffer element is an n-type dopant. For example, where the rough buffer layer 102 is or comprises silicon, the buffer element may be arsenic, phosphorous, or some other suitable n-type dopant for silicon. In alternative embodiments, the buffer element is a p-type dopant. In some embodiments, the rough buffer layer 102 is doped with multiple buffer elements, each as described above.

The rough buffer layer 102 may, for example, be formed by an individual metal organic chemical vapor deposition (MOCVD) process, a shared MOCVD process, a silicon epitaxial deposition process, or some other suitable deposition process. The individual MOCVD process is individual to the rough buffer layer 102 and is not used to form the rough buffer layer 102 with a subsequently described seed buffer layer. The shared MOCVD process is shared by the rough buffer layer 102 and the subsequently described seed buffer layer, such that the rough buffer layer 102 and the seed buffer layer are formed together.

In at least some embodiments in which the buffer element is or comprises arsenic or phosphorus, the rough buffer layer 102 is formed by the silicon epitaxial deposition process. The silicon epitaxial deposition process may, for example, be or comprise molecular-beam epitaxy (MBE), vapor phase epitaxy (VPE), liquid phase epitaxy (LPE), some other suitable silicon epitaxial deposition process, or any combination of the foregoing. In at least some embodiments in which the buffer element is or comprises magnesium or zinc, the rough buffer layer 102 is formed by the individual MOCVD process. In at least some embodiments in which the buffer element is or comprises carbon, the rough buffer layer 102 is formed by the individual or shared MOCVD process or the silicon epitaxial process.

In some embodiments, the individual MOCVD process comprises introducing a silicon-containing precursor and a buffer-element-containing precursor into the first process chamber 802 at a process temperature of about 600-1000 degrees Celsius. Other process temperatures are, however, amenable. The silicon-containing precursor may, for example, be or comprise silane (e.g., $SiH_4$) or some other suitable precursor containing silicon. In embodiments in which the buffer element is or comprises carbon, the buffer-element-containing precursor may, for example, be or comprise cyclohexane (e.g., $C_6H_{12}$), trimethylaluminium (e.g., $Al_2(CH_3)_6$), or some other suitable precursor containing carbon. In embodiments in which the buffer element is or comprises magnesium, the buffer-element-containing precursor may, for example, be or comprise Bis(cyclopentadienyl)magnesium (e.g., $Cp_2Mg$) or some other suitable precursor containing magnesium. In embodiments in which the buffer element is or comprises zinc, the buffer-element-containing precursor may, for example, be or comprise dimethylzinc (e.g., $C_2H_6Zn$) or some other suitable precursor containing zinc.

Figure 9:
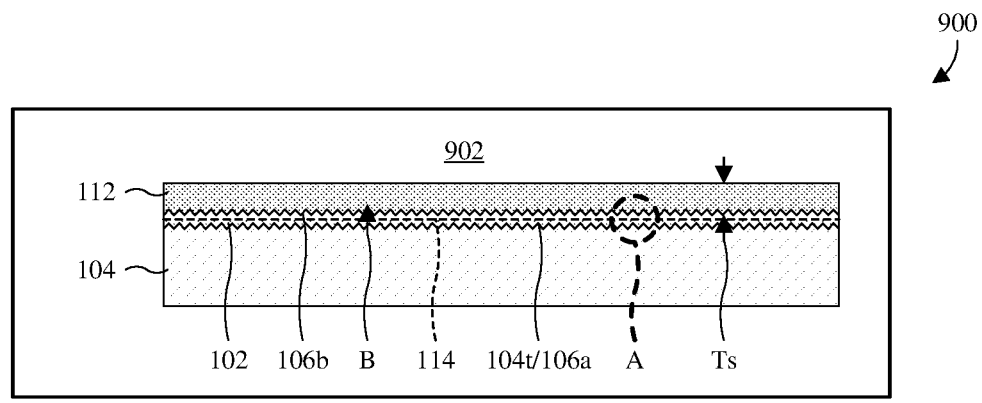

As illustrated by the cross-sectional view 900 of FIG. 9, a seed buffer layer 112 is epitaxially formed overlying and directly contacting the rough buffer layer 102 at a second buffer interface 106b. Further, the seed buffer layer 112 is formed using the rough buffer layer 102 as a seed or nucleation layer and is formed within a second process chamber 902. The seed buffer layer 112 serves as a seed or nucleation layer for growing a group III-V semiconductor layer hereafter formed on the seed buffer layer 112. The seed buffer layer 112 may, for example, be or comprise aluminum nitride, some other suitable group suitable III nitride, or some other suitable group III-V material. Further, the seed buffer layer 112 may, for example, have a thickness Ts of about 100-350 angstroms or some other suitable value.

The seed buffer layer 112 may, for example, be formed by an MOCVD process or some other suitable deposition process. In some embodiments, the seed buffer layer 112 is formed at a process temperature of about 700-1150 degrees Celsius and/or is formed while the second process chamber 1102 has a chamber pressure of about 50-200 millibars. Other process temperatures and/or chamber pressures are, however, amenable.

In some embodiments, the seed buffer layer 112 and the rough buffer layer 102 are formed together in a common process chamber by the shared MOCVD process mentioned above with regard to formation of the rough buffer layer 102. In such embodiments, the first and second process chambers 802, 902 respectively of FIGS. 8 and 9 are the same. Forming the seed buffer layer 112 and the rough buffer layer 102 by the shared MOCVD process may, for example, improve throughput and may, for example, reduce costs. In alternative embodiments, the seed buffer layer 112 and the rough buffer layer 102 are formed independently in separate process chambers. In such embodiments, the first and second process chambers 802, 902 respectively of FIGS. 8 and 9 are different.

In some embodiments, the shared MOCVD process comprises at least two steps: 1) a first step to form the rough buffer layer 102 doped with carbon; and 2) a second step to form the seed buffer layer 112 on the rough buffer layer 102. During the first step, a carbon-containing aluminum precursor is introduced into to the common process chamber (e.g., the first and second process chambers 802, 902 respectively of FIGS. 8 and 9, which are the same in these embodiments). During the second step, a nitrogen precursor is also introduced into the common process chamber. Hence, the carbon-containing aluminum precursor, but not the nitrogen precursor, is introduced into the common process chamber during the first step and both the carbon-containing aluminum precursor and the nitrogen precursor are introduced into the common process chamber during the second step. The carbon-containing aluminum precursor may be or comprise, for example, trimethylaluminium or some other suitable precursor. In some embodiments in which the carbon-containing aluminum precursor is or comprises trimethylaluminium, the carbon-containing aluminum precursor is introduced into the common process chamber at about 90-120 standard cubic centimeters per minute (SCCM) or some other suitable rate. The nitrogen precursor may be or comprise, for example, ammonia (e.g., $NH_3$) or some other suitable precursor. The first step may, for example, persist for about 30-180 seconds or some other suitable amount of time, and/or the second step may, for example, persist for about 3-30 minutes or some other suitable amount of time.

Because the seed buffer layer 112 is a different semiconductor material than the rough buffer layer 102 and the substrate 104, band bending occurs at the rough buffer layer 102 and the substrate 104. In at least some embodiments, the band bending induces formation of a 2DHG 114 extending along the first and second buffer interfaces 106a, 106b at the rough buffer layer 102. The 2DHG 114 has a high concentration of mobile holes and hence has a low resistance. The low resistance of the 2DHG 114 decreases an overall resistance of the substrate 104. The decrease in overall resistance increases substrates losses and decreases PAE when the group III-V device is used for RF applications. Further, the decrease in overall resistance degrades CPW when the group III-V device is used for RF applications.

However, the rough buffer layer 102 counteracts the negative effects of the 2DHG 114. The roughness at the top and bottom surfaces of the rough buffer layer 102 increases carrier scattering at the top and bottom surfaces and hence reduces carrier mobility at the 2DHG 114. The reduced carrier mobility increases a resistance at the 2DHG 114 and hence increases an overall resistance of the substrate 104. The increased overall resistance reduces substrate losses and increases PAE when the group III-V device is used for RF applications. Further, the increased overall resistance enhances CPW when the group III-V device is used for RF applications. In at least some embodiments in which the rough buffer layer 102 is doped with n-type dopants, excess electrons of the rough buffer layer 102 counter mobile holes of the 2DHG 114 and further increase resistance at the 2DHG 114 to further reduce substrate losses.

Figure 10:
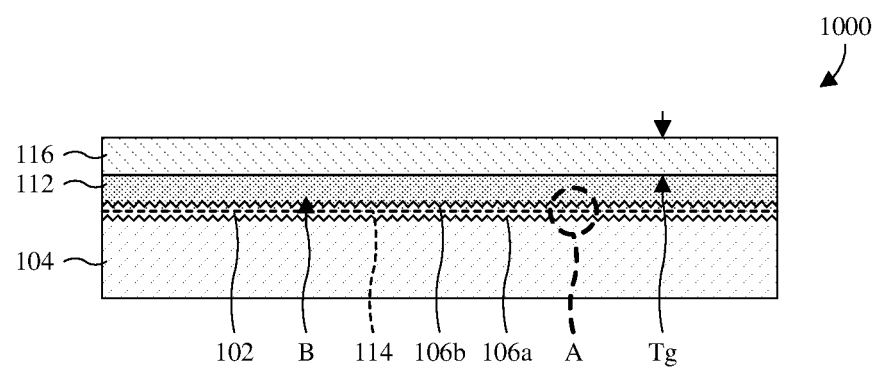

As illustrated by the cross-sectional view 1000 of FIG. 10, a graded buffer layer 116 is formed on the seed buffer layer 112. The graded buffer layer 116 is or comprises a group III-V semiconductor material with a first element and a second element respectively having atomic percentages that are graded. For example, the first element may have an atomic percentage increasing from a bottom surface of the graded buffer layer 116 to a top surface of the graded buffer layer 116, whereas the second element may have an atomic percentage decreasing from the bottom surface to the top surface. The first and second buffer layers may, for example, be group III elements. The second element may, for example, be a group III element of the seed buffer layer 112, and/or the first may, for example, be a group III element found in group III-V layers subsequently formed on the graded buffer layer. The graded buffer layer 116 may, for example, be or comprise aluminum gallium nitride, some other suitable group III nitride, or some other suitable group III-V material. In some embodiments, the graded buffer layer 116 has a thickness Tg of about 0.5-1.5 micrometers or some other suitable value.

The graded buffer layer 116 may, for example, be formed by MOCVD, some other suitable epitaxial process, or some other suitable deposition process. In some embodiments, the graded buffer layer 116 is formed at a process temperature of about 1000-1150 degrees Celsius and/or within a process chamber having a chamber pressure of about 50-200 millibars. Other process temperatures and/or chamber pressures are, however, amenable.

Figure 11:
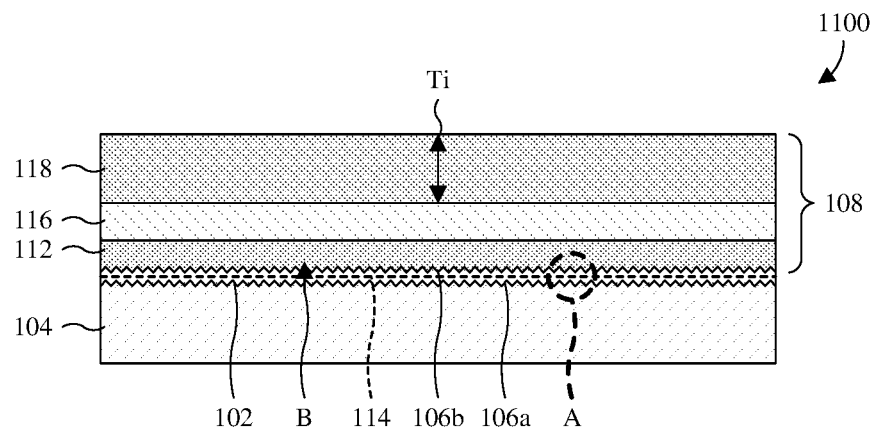

As illustrated by the cross-sectional view 1100 of FIG. 11, an isolation buffer layer 118 is formed on the graded buffer layer 116. The isolation buffer layer 118 is or comprises a group III-V semiconductor material doped with a buffer element so as to have a high resistance. The high resistance may, for example, be a resistance higher than that of a channel layer hereafter discussed (see, e.g., FIG. 12). The high resistance allows the isolation buffer layer 118 to act as "back barrier" for a channel layer hereafter formed so as to reduce substrate losses and to increase the soft breakdown voltage of the group III-V device being formed. The buffer element may, for example, be carbon, iron, or some other suitable buffer element. The isolation buffer layer 118 may be or comprise, for example, gallium nitride, some other suitable group III nitride, or some other suitable group III-V material. In some embodiments, the isolation buffer layer 118 shares a group III element and/or a group V element with the graded buffer layer 116 and/or the seed buffer layer 112. In some embodiments, a thickness of the isolation buffer layer 118 is about 0.5-2.5 micrometers or some other suitable value.

The isolation buffer layer 118 may, for example, be formed by MOCVD, some other suitable epitaxial process, or some other suitable deposition process. In some embodiments, the isolation buffer layer 118 is formed at a process temperature of about 900-1050 degrees Celsius and/or within a process chamber having a chamber pressure of about 50-500 millibars. Other process temperatures and/or chamber pressures are, however, amenable.

Collectively, the seed buffer layer 112, the graded buffer layer 116, and the isolation buffer layer 118 define a group III-V buffer structure 108. The group III-V buffer structure 108 and the rough buffer layer 102 may, for example, compensate for differences in lattice constants, crystalline structures, thermal expansion coefficients, or any combination of the foregoing between the substrate 104 and a heterojunction structure hereafter formed on the group III-V buffer structure 108. By compensating for these differences, the group III-V buffer structure 108 and the rough buffer layer 102 may alleviate stress, which may, for example, reduces leakage current and/or reduce warping of the substrate 104.

Figure 12:
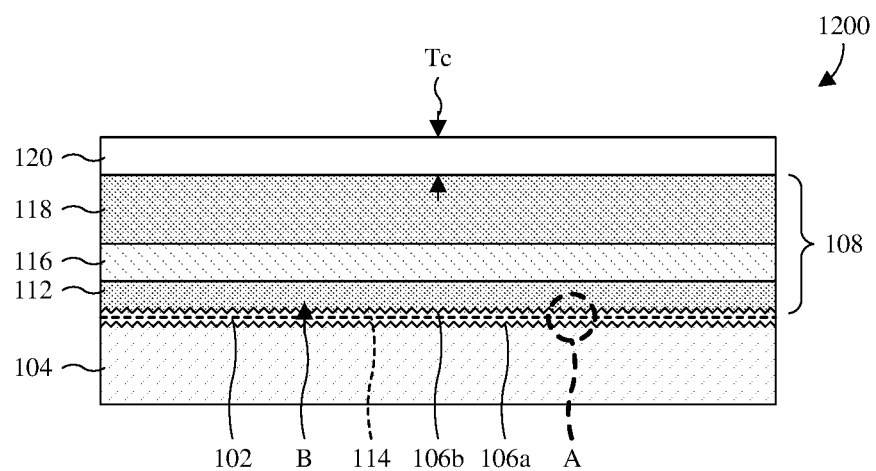

As illustrated by the cross-sectional view 1200 of FIG. 12, a channel layer 120 is formed on the isolation buffer layer 118. The channel layer 120 is or comprises an undoped group III-V semiconductor material. In some embodiments, the channel layer 120 is or comprises the same group III-V semiconductor material as the isolation buffer layer 118, except that the channel layer 120 is undoped whereas the isolation buffer layer 118 is doped. The channel layer 120 may, for example, be or comprise gallium nitride, some other suitable group III nitride, or some other suitable group III-V material. In some embodiments, the channel layer 120 has a thickness Tc of about 0.2-0.6 micrometers or some other suitable thickness value.

The channel layer 120 may, for example, be formed by MOCVD, some other suitable epitaxial process, some other suitable deposition process. In some embodiments, the channel layer 120 is formed at a process temperature of about 950-1050 degrees Celsius and/or within a process chamber having a chamber pressure of about 100-650 millibars. Other process temperatures and/or chamber pressures are, however, amenable.

Figure 13:
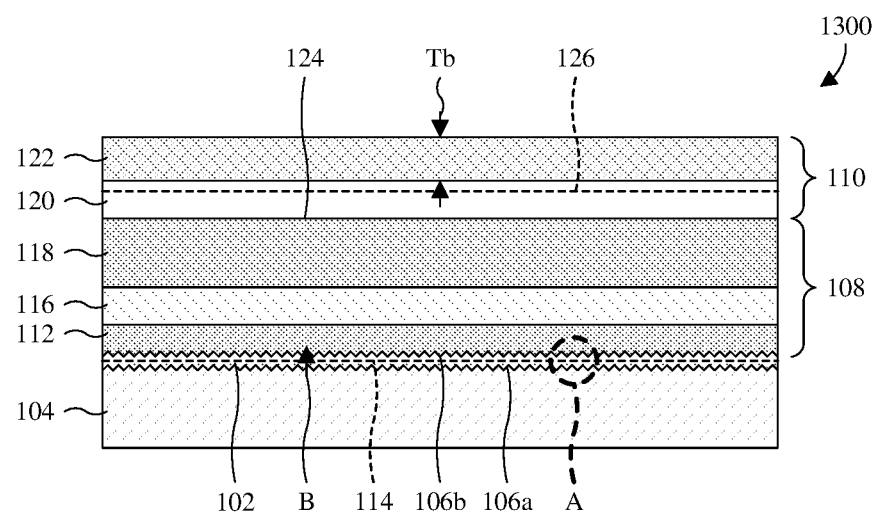

As illustrated by the cross-sectional view 1300 of FIG. 13, a barrier layer 122 is formed overlying and directly contacting the channel layer 120. The barrier layer 122 is a group III-V semiconductor material with a band gap unequal to that of the channel layer 120. Because of the unequal band gaps, the channel layer 120 and the barrier layer 122 define a heterojunction at a heterojunction interface 124 at which the channel layer 120 and the barrier layer 122 directly contact. Hence, the channel layer 120 and the barrier layer 122 collectively define a group III-V heterojunction structure 110. Further, the barrier layer 122 is polarized so positive charge is shifted towards a bottom surface of the barrier layer 122 and negative charge is shifted towards a top surface of the barrier layer 122. Because the barrier layer 122 is polarized, a 2DEG 126 forms in the channel layer 120. The 2DEG 126 extends along the heterojunction interface 124 and has a high concentration of mobile electrons. Because of the high concentration of mobile electrodes, the 2DEG 126 is conductive. The barrier layer 122 may be or comprise, for example, aluminum gallium nitride, some other suitable group III nitride, or some other suitable group III-V material. In some embodiments, the barrier layer 122 is or comprises $Al_yGa_{1-y}N$, where y is about 0.1-0.2. In some embodiments, the barrier layer 122 has a thickness Tb of about 5-30 nanometers or some other suitable thickness value.

The barrier layer 122 may, for example, be formed by MOCVD, some other suitable epitaxial process, or some other suitable deposition process. In some embodiments, the barrier layer 122 is formed at a process temperature of about 1000-1100 degrees Celsius and/or within a process chamber having a chamber pressure of about 50-100 millibars. Other process temperatures and/or chamber pressures are, however, amenable.

Figure 14:
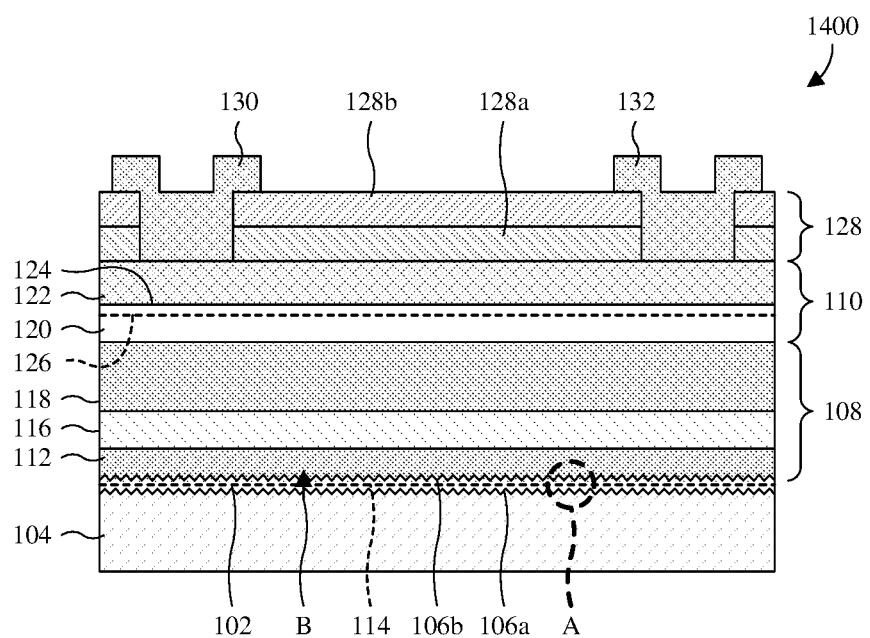

While not shown, a cap layer may be formed on the graded buffer layer 116 before a first passivation layer is hereafter formed at FIG. 14. The cap layer is or comprises a group III-V semiconductor material with a band gap unequal to that of the barrier layer 122. The cap layer may, for example, be or comprise gallium nitride, some other suitable group III nitride, or some other suitable group III-V material. In some embodiments, the cap layer 502 is or comprises a binary group III-V material and/or comprises the same elements as the channel layer 120. In some embodiment, the cap layer is undoped, an example of which is described with regard to FIG. 5B. In alternative embodiments, the cap layer is doped with p-type or n-type dopants, an example of which is described with regard to FIG. 5C.

In some embodiments, the cap layer is or comprises gallium nitride, the barrier layer 122 is or comprises aluminum gallium nitride, and the cap layer and the barrier layer 122 are formed in situ within a common process chamber and/or a common multi-chamber process tool. The cap layer protects the barrier layer 122 during formation of the group III-V device so native oxide does not form from the barrier layer 122. Instead, native oxide may form from the cap layer. Native oxide from gallium nitride is more stable and more readily cleaned than native oxide from aluminum gallium nitride. Further, cleaning native oxide from the cap layer does not risk damaging the barrier layer 122.

As illustrated by the cross-sectional view 1400 of FIG. 14, a first passivation layer 128 is formed over the group III-V heterojunction structure 110. The first passivation layer 128 comprises a lower dielectric layer 128a and an upper dielectric layer 128b overlying the lower dielectric layer 128a. In alternative embodiments, the lower or upper dielectric layer 128a, 128b is omitted. The lower dielectric layer may, for example, be or comprise silicon oxide, silicon nitride, some other suitable dielectric(s), or any combination of the foregoing. The upper dielectric layer 128b may, for example, be or comprise plasma-enhanced silicon oxide and/or some other suitable dielectric(s). The first passivation layer 128 may, for example, be formed by plasma-enhanced chemical vapor deposition (PECVD), low pressure chemical vapor deposition (LPCVD), atmospheric-pressure chemical vapor deposition (APCVD), atomic layer deposition (ALD), some other suitable deposition process(es), or any combination of the foregoing.

Also illustrated by the cross-sectional view 1400 of FIG. 14, a first source/drain electrode 130 and a second source/drain electrode 132 are formed overlying the first passivation layer 128. Further, the first and second source/drain electrodes protrude through the first passivation layer 128 and terminate at a top surface of the barrier layer 122. In alternative embodiments, the first and second source/drain electrodes 130, 130 protrude through the barrier layer 122 and terminate at the channel layer 120. See, for example, FIG. 5A. The first and second source/drain electrodes 130, 132 may, for example, be or comprise metal and/or some other suitable conductive material(s).

A process for forming the first and second source/drain electrodes 130, 132 may, for example, comprise: 1) patterning the first passivation layer 128 to form openings corresponding to the first and second source/drain electrodes 130, 132; 2) depositing a metal layer covering the first passivation layer and filling the openings; and 3) patterning the metal layer into the first and second source/drain electrodes 130, 132. Other processes are, however, amenable. The patterning of the first passivation layer 128 and the metal layer may, for example, each be performed by a photolithography/etching process or some other suitable patterning process. The photolithography/etching process for at least the first passivation layer 128 may, for example, employ dry etching or some other suitable etching type. The depositing of the metal layer may, for example, be performed by PECVD, LPCVD, APCVD, ALD, some other suitable deposition process(es), or any combination of the foregoing.

Figure 15:
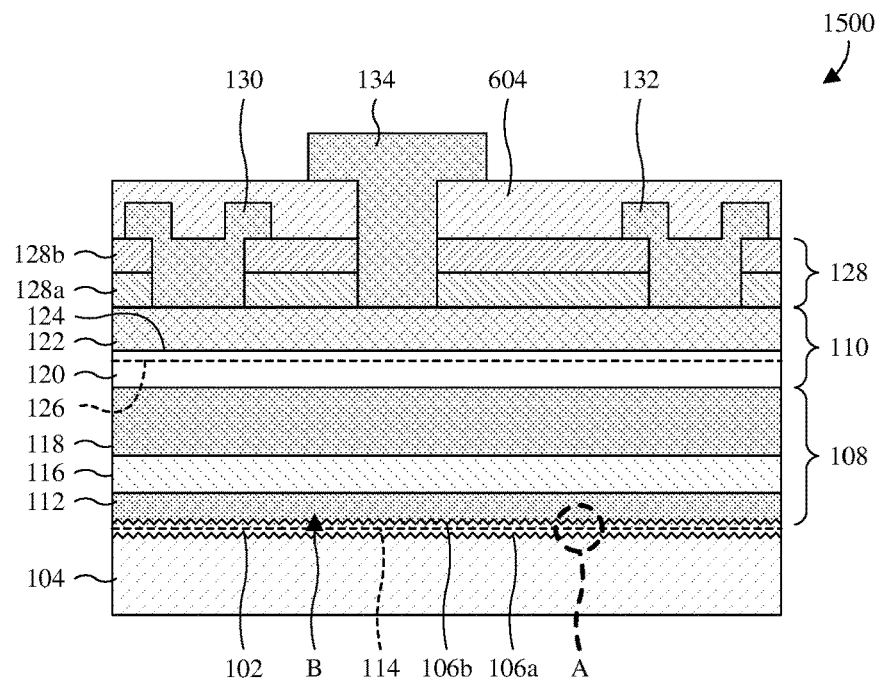

As illustrated by the cross-sectional view 1500 of FIG. 15, a second passivation layer 604 and a gate electrode 134 are formed over the first and second source/drain electrodes 130, 132 and the first passivation layer 128. The gate electrode 134 overlies the second passivation layer 604 and protrudes through the first and second passivation layers 128, 604. Further, the gate electrode 134 protrudes to and terminates at a top surface of the barrier layer 122. The second passivation layer 604 may, for example, be or comprise plasma-enhanced silicon nitride and/or some other suitable dielectric(s). The second passivation layer 604 may, for example, be formed as the first passivation layer 128 is formed. The gate electrode 134 may, for example, be or comprise metal and/or some other suitable conductive material(s). The gate electrode 134 may, for example, be formed as the first and second source/drain electrodes 130, 132 are formed.

While the first and second source/drain electrodes 130, 132 and the gate electrode 134 are illustrated as being formed separately, the first and second source/drain electrodes 130, 132 and the gate electrode 134 may alternatively be formed together. In such embodiments, the second passivation layer 604 is omitted. Further, the above process for forming the first and second source/drain electrodes 130, 132 forms the gate electrode 134 in parallel with the first and second source/drain electrodes 130, 132. While the gate electrode 134 extends to the group III-V heterojunction structure 110, a gate dielectric layer may alternatively be formed separating the gate electrode 134 from the group III-V heterojunction structure 110. Examples of such a gate dielectric layer are in FIGS. 5D and 5E.

Figure 16:
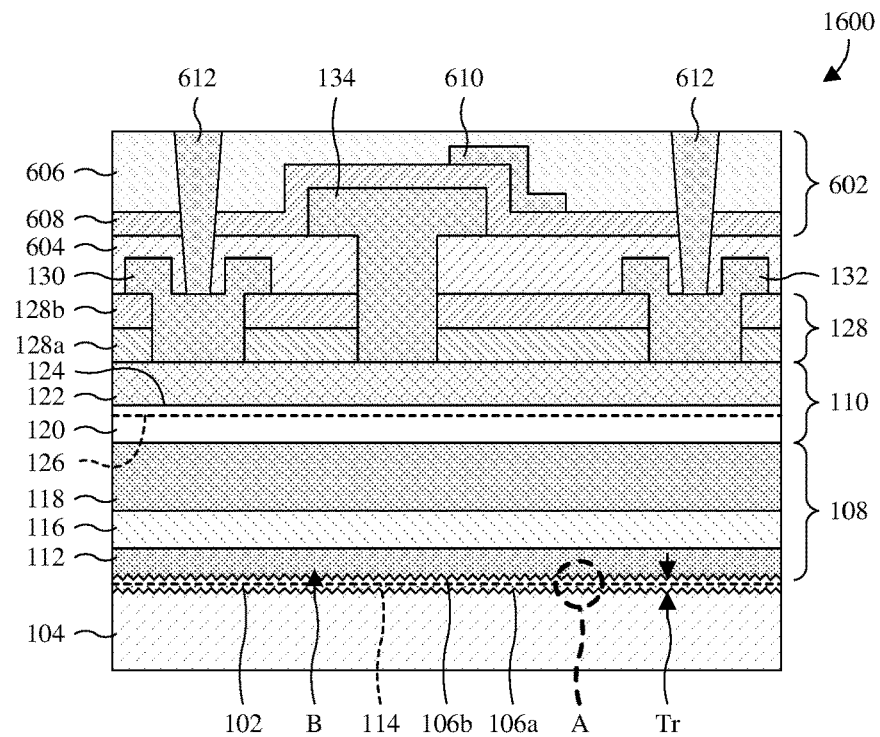

As illustrated by the cross-sectional view 1600 of FIG. 16, an interconnect structure 602 is formed over the second passivation layer 604 and the gate electrode 134. The interconnect structure 602 comprises an ILD layer 606 and an ILD liner 608. The ILD liner 608 underlies the ILD layer 606 and separates the ILD layer 606 from the gate electrode 134 and the second passivation layer 604. The interconnect structure 602 further comprises a field plate 610 and a plurality of contact vias 612 in the ILD layer 606. The field plate 610 wraps around a top corner of the gate electrode 134 while remaining separated from the gate electrode 134 by the ILD liner 608. The contact vias 612 extend through the ILD layer 606 and the ILD liner 608 respectively to the first and second source/drain electrodes 130, 132.

While FIGS. 7-16 are described with reference to a method, it will be appreciated that the structures shown in FIGS. 7-16 are not limited to the method but rather may stand alone separate of the method. While FIGS. 7-16 are described as a series of acts, it will be appreciated that the order of the acts may be altered in other embodiments. While FIGS. 7-16 illustrate and describe as a specific set of acts, some acts that are illustrated and/or described may be omitted in other embodiments. Further, acts that are not illustrated and/or described may be included in other embodiments.

Figure 17:
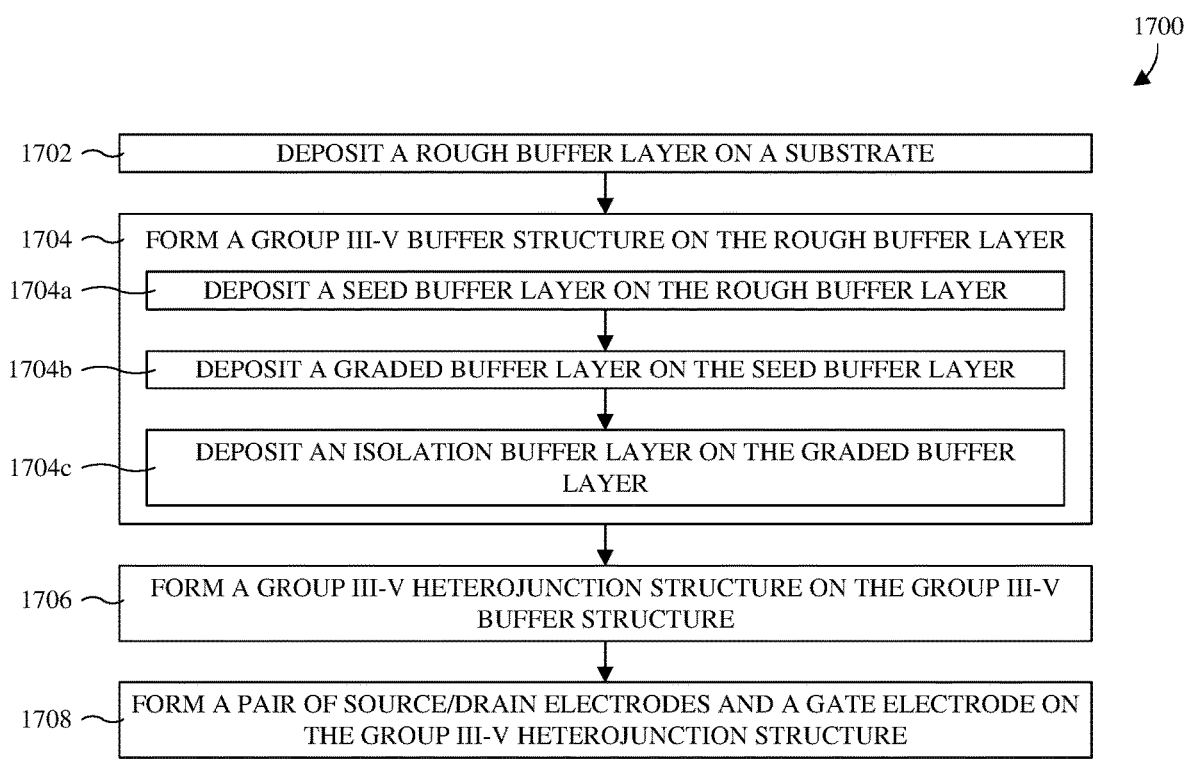
FIG. 17 illustrates a flowchart of some embodiments of the method of FIGS. 6-16.

With reference to FIG. 17, a block diagram 1700 of some embodiments of the method of FIGS. 7-16 is provided.

At 1702, a rough buffer layer is deposited on a substrate. See, for example, FIG. 8.

At 1704, a group III-V buffer structure is formed on the rough buffer layer. See, for example, FIGS. 9-11. At 1704a, the forming of the group III-V buffer structure comprises depositing a seed buffer layer on the rough buffer layer. See, for example, FIG. 9. At 1704b, the forming of the group III-V buffer structure comprises depositing a graded buffer layer on the seed buffer layer. See, for example, FIG. 10. At 1704c, the forming of the group III-V buffer structure comprises depositing an isolation buffer layer on the graded buffer layer. See, for example, FIG. 11. In alternative embodiments, the group III-V buffer structure is wholly omitted. In alternative embodiments, the group III-V buffer structure is partially omitted, such that the seed buffer layer, the graded buffer layer, the isolation buffer layer, some other buffer layer(s) (not shown in FIGS. 7-16), or any combination of the foregoing is/are omitted.

The seed buffer layer induces formation of a 2DHG in the rough buffer layer. This, in turn, decreases a resistance of the substrate and increases substrate losses, whereby PAE is reduced when the group III-V device is used for RF applications. The rough surfaces of the rough buffer layer, however, counteract the negative effects of the 2DHG by scattering carriers at the rough surfaces. This reduces carrier mobility at the 2DHG and increases the resistance at the 2DHG. The increased resistance, in turn, decreases substrates losses and increases PAE.

At 1706, a group III-V heterojunction structure is formed on the group III-V buffer structure. See, for example, FIGS. 12 and 13.

At 1708, a pair of source/drain electrodes and a gate electrode are formed on the group III-V heterojunction structure. See, for example, FIGS. 14 and 15.

While the block diagram 1700 of FIG. 17 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a semiconductor device including: a substrate; a group III-V buffer structure overlying the substrate; a group III-V heterojunction structure overlying the group III-V buffer structure; a pair of source/drain electrodes overlying the group III-V heterojunction structure; a gate electrode overlying the group III-V heterojunction structure, laterally between the source/drain electrodes; and a rough buffer layer between the substrate and the group III-V buffer structure, wherein the rough buffer layer directly contacts the substrate and the group III-V buffer structure respectively at a first interface and a second interface, wherein the first interface is rough throughout and/or the second interface is rough throughout, and wherein the rough buffer layer shares a common semiconductor element with the substrate. In some embodiments, the first or second interface has a wavy profile alternating between randomly sized bumps. In some embodiments, a thickness of the rough buffer layer varies throughout the rough buffer layer. In some embodiments, the thickness of the rough buffer layer has a maximum thickness value and a minimum thickness value, wherein the maximum thickness value is about 1.2-5.1 times the minimum thickness value. In some embodiments, the first and second interfaces are rough throughout. In some embodiments, the rough buffer layer includes monocrystalline silicon doped with carbon, magnesium, zinc, arsenic, or phosphorous. In some embodiments, the group III-V buffer structure includes: an aluminum nitride layer overlying and directly contacting the rough buffer layer; and a graded aluminum gallium nitride layer overlying the aluminum nitride layer and having an atomic percentage of aluminum that is graded from top to bottom.

In some embodiments, the present disclosure provides another semiconductor device including: a silicon substrate; a group III-V buffer structure overlying the silicon substrate; a group III-V heterojunction structure overlying the group III-V buffer structure; a pair of source/drain electrodes overlying the group III-V heterojunction structure; a gate electrode overlying the group III-V heterojunction structure, laterally between the source/drain electrodes; a buffer layer between the silicon substrate and the group III-V buffer structure; and a 2DHG in the buffer layer, wherein a top surface of the buffer layer and/or a bottom surface of the buffer layer is/are configured to scatter mobile holes in the 2DHG to reduce carrier mobility at the 2DHG. In some embodiments, the top and bottom surfaces of the buffer layer have a plurality of randomly sized bumps arranged throughout. In some embodiments, one of the top and bottom surfaces of the buffer layer is rough compared to another one of the top and bottom surfaces of the buffer layer. In some embodiments, the buffer layer includes silicon doped with an n-type dopant, wherein the silicon substrate is substantially devoid of the n-type dopant. In some embodiments, the group III-V buffer structure includes a group III-V layer consisting essentially of aluminum and nitride, wherein the group III-V layer overlies and directly contacts the buffer layer. In some embodiments, the buffer layer consists essentially of doped silicon.

In some embodiments, the present application provides a method for forming a semiconductor device, the method including: depositing a rough buffer layer over and directly contacting a top surface of a substrate, wherein the depositing of the rough buffer layer roughens the top surface of the substrate; depositing a seed buffer layer over and directly contacting the rough buffer layer; forming heterojunction structure overlying the seed buffer layer; forming a pair of source/drain electrodes on the heterojunction structure; and forming a gate electrode on the heterojunction structure, laterally between the source/drain electrodes. In some embodiments, the rough buffer layer is deposited in a first process chamber, wherein the seed buffer layer is deposited in a second process chamber different than the first process chamber. In some embodiments, the depositing of the rough buffer layer includes MOCVD using a first precursor including silicon and a second precursor including carbon, magnesium, or zinc. In some embodiments, the depositing of the rough buffer layer is performed by a silicon epitaxial tool and forms the rough buffer layer including silicon doped with arsenic or phosphorous. In some embodiments, the rough buffer layer and the seed buffer layer are deposited in a common process chamber. In some embodiments, the rough buffer layer and the seed buffer layer are deposited by a shared MOCVD process, wherein the shared MOCVD process includes: introducing a first precursor, but not a second precursor, into the common process chamber to form the rough buffer layer; and after forming the rough buffer layer, introducing both the first and second precursors into the common process chamber to form the seed buffer layer. In some embodiments, the seed buffer layer induces formation of a 2DHG along the top surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
depositing a rough buffer layer overlying and directly contacting a silicon substrate, wherein the rough buffer layer has a bottom surface and a top surface that each has alternating peaks and valleys at completion of the depositing of the rough buffer layer;

depositing an aluminum nitride buffer layer overlying and directly contacting the rough buffer layer at the top surface of the rough buffer layer;

depositing a gallium nitride layer and an aluminum gallium nitride layer directly contacting each other at a heterojunction and both overlying the aluminum nitride buffer layer;

forming a source electrode and a drain electrode overlying the gallium nitride layer and the aluminum gallium nitride layer; and forming a gate electrode overlying the gallium nitride layer and the aluminum gallium nitride layer, laterally between the source electrode and the drain electrode;

wherein the rough buffer layer is a semiconductor material with a band gap within 0.7 electron volts (eV) of a band gap of the silicon substrate.

2. The method according to claim 1, wherein the band gap of the rough buffer layer is less than 1.3 electron volts (eV).

3. The method according to claim 1, further comprising:
performing an etch into a top surface of the silicon substrate to form a series of peaks and valleys spanning a width of the silicon substrate, wherein the rough buffer layer is deposited after the etch.

4. The method according to claim 1, further comprising:
depositing a graded aluminum gallium nitride buffer layer overlying and directly contacting the aluminum nitride buffer layer.

5. The method according to claim 1, wherein the depositing of the rough buffer layer concurrently dopes the rough buffer layer with a buffer element, wherein a doping concentration of the buffer element increases linearly from the bottom surface of the rough buffer layer to a midpoint spaced from and between the top and bottom surfaces of the rough buffer layer, and wherein the doping concentration is constant from the midpoint to the top surface of the rough buffer layer.

6. A method for forming a semiconductor device, the method comprising:
depositing a rough buffer layer overlying and directly contacting a semiconductor substrate, wherein the rough buffer layer has a top profile and a bottom profile that each alternates between peaks and valleys from a first sidewall of the semiconductor substrate to a second sidewall of the semiconductor substrate opposite the first sidewall;

depositing a group III-V buffer layer overlying and directly contacting the rough buffer layer at a top surface of the rough buffer layer;

forming a heterojunction structure overlying the group III-V buffer layer, wherein the heterojunction structure comprises a group III-V channel layer and a group III-V barrier layer directly contacting at a heterojunction;

forming a source electrode and a drain electrode overlying the heterojunction structure; and forming a gate electrode overlying the heterojunction structure, laterally between the source electrode and the drain electrode;

wherein the rough buffer layer comprises a semiconductor material, wherein the depositing of the rough buffer layer concurrently dopes the semiconductor material with a buffer element, the buffer element being magnesium, zinc, or an n-type dopant, and wherein the depositing of the rough buffer layer comprises a metal organic chemical vapor deposition (MOCVD) process in which a silicon-containing precursor and a buffer-element containing precursor are introduced into a process chamber.

7. The method according to claim 6, wherein the rough buffer layer is only doped with magnesium, zinc, or the n-type dopant during the depositing of the rough buffer layer.

8. The method according to claim 6, wherein the rough buffer layer, upon completion of the depositing of the rough buffer layer, consists essentially of: the semiconductor material; and magnesium, zinc, or the n-type dopant.

9. The method according to claim 6, wherein the silicon-containing precursor comprises silane, and wherein the buffer-element containing precursor comprises Bis(cyclopentadienyl)magnesium or dimethylzinc.

10. The method according to claim 6, wherein the buffer element is the n-type dopant.

11. The method according to claim 6, wherein a doping concentration of the buffer element increases linearly from a bottom surface of the rough buffer layer to a midpoint spaced from and between the bottom surface and the top surface of the rough buffer layer, and wherein the doping concentration is constant from the midpoint to the top surface of the rough buffer layer.

12. The method according to claim 6, wherein a band gap of the rough buffer layer is less than 1.3 electron volts (eV).

13. The method according to claim 6, wherein the rough buffer layer consists essentially of silicon doped with the buffer element.

14. A method for forming a semiconductor device, the method comprising:
depositing a rough buffer layer overlying and directly contacting a semiconductor substrate, wherein the rough buffer layer has a top profile and a bottom profile that each alternates between peaks and valleys from a first sidewall of the semiconductor substrate to a second sidewall of the semiconductor substrate opposite the first sidewall;

depositing a group III-V buffer layer overlying and directly contacting the rough buffer layer at a top surface of the rough buffer layer;

forming a heterojunction structure overlying the group III-V buffer layer, wherein the heterojunction structure comprises a group III-V channel layer and a group III-V barrier layer directly contacting at a heterojunction;

forming a source electrode and a drain electrode overlying the heterojunction structure; and forming a gate electrode overlying the heterojunction structure, laterally between the source electrode and the drain electrode;

wherein the rough buffer layer comprises a semiconductor material, wherein the depositing of the rough buffer layer concurrently dopes the semiconductor material with a buffer element, the buffer element being magnesium, zinc, or an n-type dopant, and wherein a band gap of the rough buffer layer is less than 1.3 electron volts (eV).

15. The method according to claim 14, wherein a doping concentration of the buffer element increases linearly from a bottom surface of the rough buffer layer to a midpoint spaced from and between the bottom surface and the top surface of the rough buffer layer, and wherein the doping concentration is constant from the midpoint to the top surface of the rough buffer layer.

16. The method according to claim 14, wherein the rough buffer layer consists essentially of silicon doped with the buffer element.

17. The method according to claim 14, wherein the buffer element is magnesium or zinc.

18. The method according to claim 14, wherein the rough buffer layer and the group III-V buffer layer are deposited in a common process chamber.

19. The method according to claim 18, wherein the rough buffer layer and the group III-V buffer layer are deposited by a shared metal organic chemical vapor deposition (MOCVD) process, and wherein the shared MOCVD process comprises:

introducing a first precursor, but not a second precursor, into the common process chamber to form the rough buffer layer; and after forming the rough buffer layer, introducing both the first and second precursors into the common process chamber to form the group III-V buffer layer.

20. The method according to claim 14, wherein the semiconductor substrate is a bulk silicon substrate, wherein the rough buffer layer is doped silicon, and wherein the group III-V buffer layer is aluminum nitride.

\* \* \* \* \*